(12) United States Patent
Liu et al.

(10) Patent No.: US 11,450,579 B2
(45) Date of Patent: Sep. 20, 2022

(54) INTEGRATED CIRCUIT COMPONENT AND PACKAGE STRUCTURE HAVING THE SAME

(71) Applicant: Taiwan Semiconductor Manufacturing Company, Ltd., Hsinchu (TW)

(72) Inventors: Tzuan-Horng Liu, Taoyuan (TW); Chao-Hsiang Yang, Hsinchu (TW); Hsien-Wei Chen, Hsinchu (TW); Ming-Fa Chen, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 10 days.

(21) Appl. No.: 17/207,736

(22) Filed: Mar. 21, 2021

(65) Prior Publication Data
US 2021/0210395 A1 Jul. 8, 2021

Related U.S. Application Data

(60) Continuation of application No. 16/596,758, filed on Oct. 9, 2019, now Pat. No. 10,957,610, which is a
(Continued)

(51) Int. Cl.
*H01L 21/66* (2006.01)
*H01L 23/498* (2006.01)
(Continued)

(52) U.S. Cl.
CPC .......... *H01L 22/32* (2013.01); *H01L 23/3157* (2013.01); *H01L 23/49822* (2013.01); *H01L 24/05* (2013.01); *H01L 24/06* (2013.01); *H01L 24/13* (2013.01); *H01L 2224/0217* (2013.01); *H01L 2224/0401* (2013.01); *H01L 2224/05556* (2013.01); *H01L 2224/06515* (2013.01); *H01L 2224/13007* (2013.01)

(58) Field of Classification Search
CPC ...................................................... H01L 22/32
See application file for complete search history.

(56) References Cited

U.S. PATENT DOCUMENTS 9,000,584 B2 4/2015 Lin et al.
9,048,222 B2 * 6/2015 Hung ...................... H01L 25/50
(Continued)

*Primary Examiner* — William A Harriston
(74) *Attorney, Agent, or Firm* — JCIPRNET

(57) ABSTRACT

An integrated circuit component includes a semiconductor substrate, conductive pads, a passivation layer and conductive vias. The semiconductor substrate has an active surface. The conductive pads are located on the active surface of the semiconductor substrate and electrically connected to the semiconductor substrate, and the conductive pads each have a contact region and a testing region, where in each of the conductive pads, an edge of the contact region is in contact with an edge of the testing region. The passivation layer is located on the semiconductor substrate, where the conductive pads are located between the semiconductor substrate and the passivation layer, and the testing regions and the contact regions of the conductive pads are exposed by the passivation layer. The conductive vias are respectively located on the contact regions of the conductive pads.

20 Claims, 27 Drawing Sheets

Related U.S. Application Data division of application No. 16/016,662, filed on Jun. 25, 2018, now Pat. No. 10,483,174.

(51) Int. Cl.
*H01L 23/31* (2006.01)
*H01L 23/00* (2006.01)

(56) References Cited

U.S. PATENT DOCUMENTS

| | | |
|---|---|---|
| 9,048,233 B2 | 6/2015 | Wu et al. |
| 9,064,879 B2 * | 6/2015 | Hung ................ H01L 24/96 |
| 9,111,949 B2 | 8/2015 | Yu et al. |
| 9,263,511 B2 | 2/2016 | Yu et al. |
| 9,281,254 B2 * | 3/2016 | Yu ..................... H01L 24/97 |
| 9,368,460 B2 | 6/2016 | Yu et al. |
| 9,372,206 B2 * | 6/2016 | Wu ................. G01R 1/0416 |
| 9,496,189 B2 * | 11/2016 | Yu .................. H01L 25/0657 |
| 10,014,218 B1 * | 7/2018 | Shih ................. H01L 24/11 |
| 10,074,604 B1 * | 9/2018 | Hou ................. H01L 24/24 |
| 2011/0304349 A1 * | 12/2011 | Stillman .......... H01L 25/0657 |
| | | 324/762.04 |

\* cited by examiner

INTEGRATED CIRCUIT COMPONENT AND PACKAGE STRUCTURE HAVING THE SAME

CROSS-REFERENCE TO RELATED APPLICATION

This application is a continuation application of and claims the priority benefit of a prior application Ser. No. 16/596,758, filed on Oct. 9, 2019. The prior application Ser. No. 16/596,758 is a divisional application of and claims the priority benefit of U.S. patent application Ser. No. 16/016,662, filed on Jun. 25, 2018 and now allowed. The entirety of each of the above-mentioned patent applications is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon. Many integrated circuits are typically manufactured on a single semiconductor wafer. The dies of the wafer may be processed and packaged at the wafer level, and various technologies have been developed for wafer level packaging.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
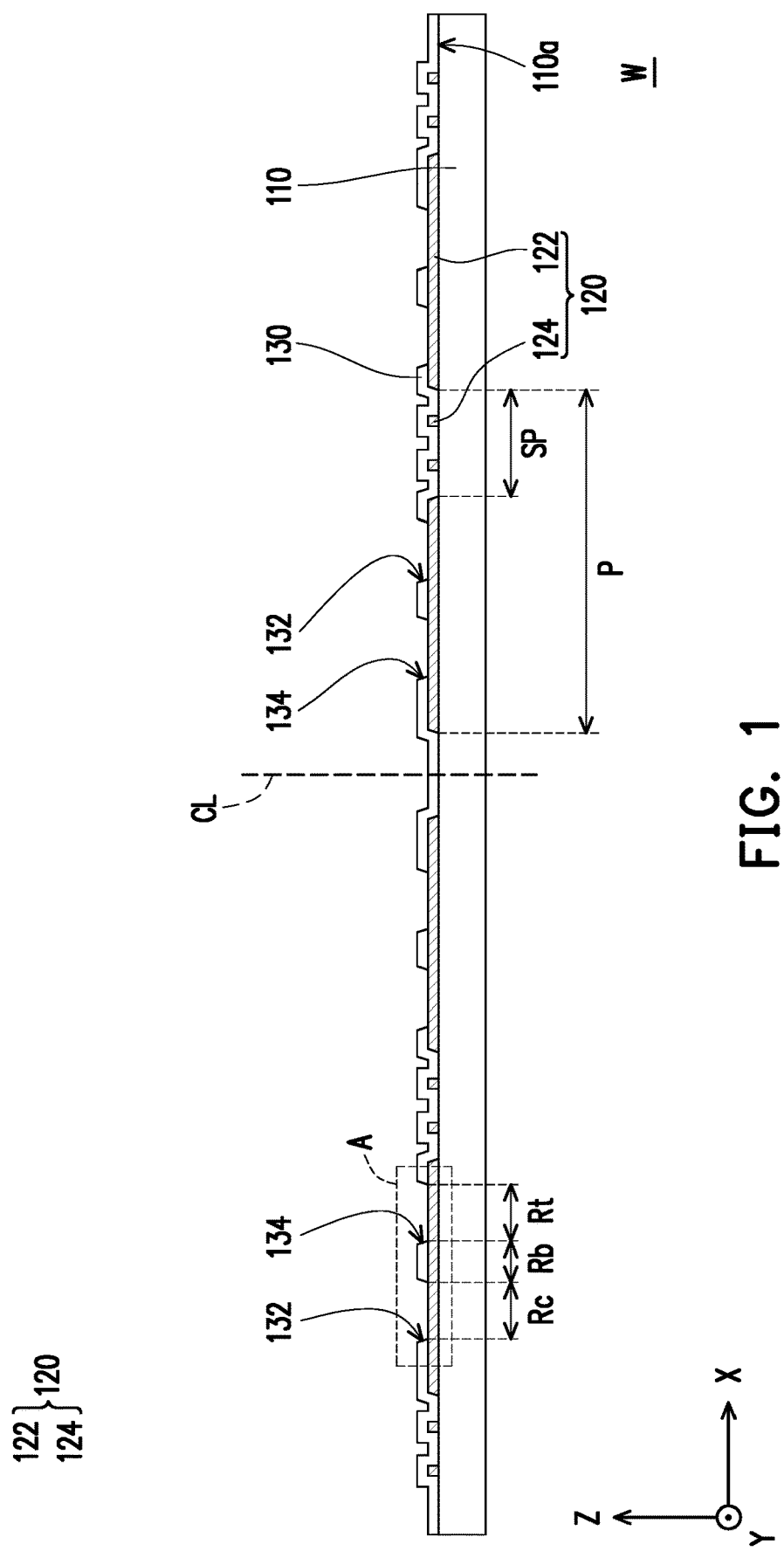
FIG. 1 to FIG. 10 are schematic cross sectional views of various stages in a manufacturing method of an integrated circuit component in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10 are schematic cross sectional views of various stages in a manufacturing method of an integrated circuit component in accordance with some embodiments of the disclosure. FIG. 21 to FIG. 27 are schematic enlarged top views partially illustrating various predetermined patterns of a part of a top metal layer of an integrated circuit component in accordance with some embodiments of the disclosure. In embodiments, the manufacturing method is part of a wafer level packaging process. In FIG. 1 to FIG. 10, two integrated circuit components are shown to represent plural integrated circuit components of the wafer, and a dotted line represents a cutting line CL for any two adjacent integrated circuit components of the wafer, for example. In other embodiments, more than two integrated circuit components may be shown to represent plural integrated circuit components of the wafer; the disclosure is not limited thereto.

Referring to FIG. 1, in some embodiments, a wafer 100 including a semiconductor substrate 110 with a conductive layer 120 and a passivation layer 130 disposed thereon is provided. In some embodiments, the semiconductor substrate 110 has an active surface 110a, the conductive layer 120 is formed on the active surface 110a and electrically connected to the semiconductor substrate 110, and the passivation layer 130 is formed on the conductive layer 120 and the active surface 110a exposed by the conductive layer 120. As shown in FIG. 1, the conductive layer 120 is partially covered by the passivation layer 130, where the conductive layer 120 is exposed by openings 132 and openings 134 formed in the passivation layer 130. As shown in FIG. 1, for example, the conductive layer 120 is located between the semiconductor substrate 110 and the passivation layer 130 along a stacking direction (e.g. a direction Z).

For example, the semiconductor substrate 110 may include a substrate including active devices (e.g., transistors and/or memories such as N-type metal oxide semiconductor (NMOS) and/or p-type metal oxide semiconductor (PMOS) devices, or the like) and/or passive devices (e.g., resistors, capacitors, inductors or the like) formed therein. In some embodiments, the above substrate may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the conductive layer 120 includes a plurality of conductive pads 122 and a plurality of conductive wirings 124. For example, the conductive layer 120 may be aluminum layer formed by electroplating or deposition, which may be patterned to form aluminum pads and aluminum lines using a photolithography and etching process. The numbers of the conductive pads 122 and the conductive wirings 124 included in the conductive layer 120 is not limited to the embodiments, may be selected based on demand and/or the design layout. As shown in FIG. 1, for example, the conductive pads 122 and the conductive wirings 124 are arranged on the active surface 110a of the semiconductor substrate 110 along a direction Y and along a direction X, where the direction X and the direction Y are different from each other and are different from the direction Z. For example, the direction X and the direction Y are perpendicular to each other. For example, the direction X is further perpendicular to the direction Y.

In certain embodiments, the conductive lines 124 are arranged in an area between any two immediately adjacent conductive pads 122 with certain design layout for providing routing-function for the semiconductor substrate 110 (e.g. the active and/or passive devices embedded therein), where the area has a size SP (which is a shortest distance measured from an edge of one conductive pad 122 to an edge of the immediately adjacent conductive pad 122) ranging from about 50 μm to about 200 μm. In some embodiments, some of the conductive pads 122 are physically connected to the conductive wirings 124, respectively. In some embodiments, a pitch P between any two of the conductive pads 122 is from about 100 μm to about 300 μm.

As shown in FIG. 1, for example, each of the conductive pads 122 has a core contact region Rc, a testing region Rt and a buffer contact region Rb. In some embodiments, the core contact region Rc is exposed by one of the openings 132 formed in the passivation layer 130 for electrically connections to later-formed layer(s) or element(s), the testing region Rt is exposed by one of the openings 134 formed in the passivation layer 130 for electrical circuit testing through a probe pin, and the buffer contact region Rb is covered by the passivation layer 130 to offer an buffer region for the core contact region Rc in electrically connections to later-formed layer(s) or element(s). In the embodiments, the core contact region Rc and the buffer contact region Rb are together referred to as a contact region of the conductive pad 122. FIG. 21 to FIG. 27 show the schematic enlarged top views of a part of a conductive layer 120 of a dotted box A depicted in FIG. 1. In FIG. 21 to FIG. 27 (e.g. a top view projecting on a X-Y plane), only one conductive pad 122 of the conductive layer 120 are featured for easy illustration, where certain structural features including the core contact region Rc, the testing region Rt and the buffer contact region Rb of the conductive pad 122 are stressed for illustration purposes.

Figure 21:
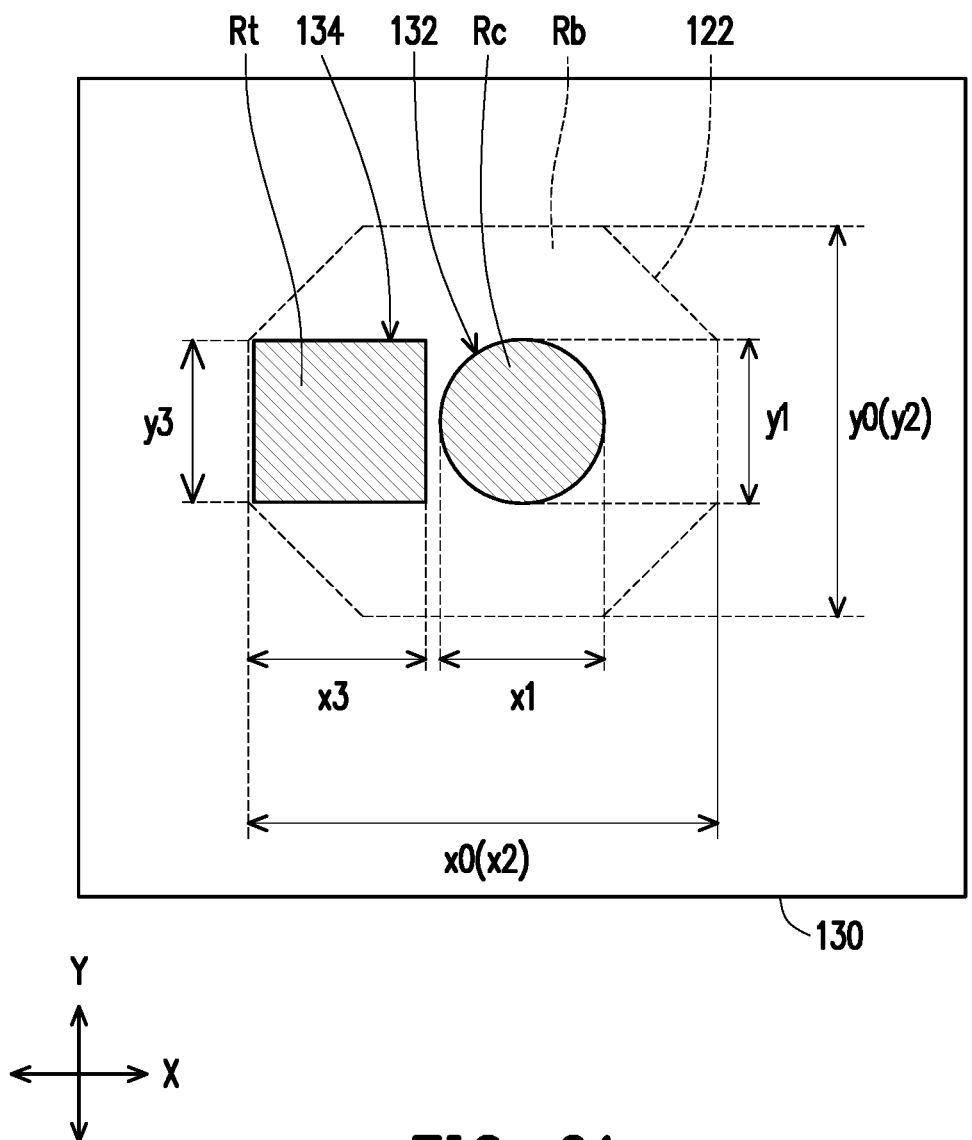
FIG. 21 to FIG. 27 are schematic enlarged top views illustrating various predetermined patterns of a part of a top metal layer of an integrated circuit component in accordance with some embodiments of the disclosure.

Referring to FIG. 1 and FIG. 21, in some embodiments, the conductive pad 122 has a length X0 on the direction X and a width Y0 on the direction Y, where the length X0 is greater than the width Y0; and thus, the direction X may be referred to as an extending direction of a long-side of the conductive pad 122, and the direction Y may be referred to as an extending direction of a short-side of the conductive pad 122. In some embodiments, the length X0 of the conductive pad 122 is approximately from 80 μm to 180 μm. In some embodiments, the width Y0 of the conductive pad 122 is approximately from 50 μm to 150 μm.

As shown in FIG. 1 and FIG. 21, in some embodiments, the core contact region Rc is entirely surrounded by the buffer contact region Rb, where the core contact region Rc has a substantially circular shape (from the top view of FIG. 21). However, the disclosure is not limited thereto; and in other embodiments, the core contact region Rc may be partially surrounded by the buffer contact region Rb. In an alternative embodiment, from the top view, the core contact region Rc may substantially have an oval shape, a square shape, a rectangular shape or any suitable polygonal shape. In some embodiments, along the extending direction of the long-side of the conductive pad 122 (e.g. the direction X), a length X1 of the core contact region Rc is approximately from 20 μm to 60 μm. In some embodiments, along the extending direction of the short-side of the conductive pad 122 (e.g. the direction Y), the width Y1 of the core contact region Rc is approximately from 20 μm to 60 μm.

In some embodiments, as shown in FIG. 21, the testing region Rt is physically contacted to the buffer contact region Rb, and the testing region Rt is separated and spaced apart from the core contact region Rc through the buffer contact region Rb, where the testing region Rt has a substantially rectangular shape. However, the disclosure is not limited thereto. In an alternative embodiment, from the top view of the conductive pad 122, the testing region Rt may substantially have an oval shape, a circular shape or any suitable polygonal shape. In some embodiments, along the extending direction of the long-side of the conductive pad 122 (e.g. the direction X), a length X3 of the testing region Rt is approximately from 30 μm to 60 μm. In some embodiments, along the extending direction of the short-side of the conductive pad 122 (e.g. the direction Y), the width Y3 of the testing region Rt is approximately from 30 μm to 60 μm.

In some embodiments, the core contact region Rc, the buffer contact region Rb and the testing region Rt together has a substantially octagonal shape, as shown in FIG. 21. The disclosure is not limited thereto. In one embodiment, the core contact region Rc, the buffer contact region Rb and the testing region Rt together may substantially have a circular shape, a rectangular shape, or any suitable polygonal shape (e.g. an octagonal shape or an octagonal shape with a protrusion extending from at least one side thereof). In some embodiments, along the extending direction of the long-side of the conductive pad 122 (e.g. the direction X), a length X2 of the buffer contact region Rb is approximately from 80 μm to 180 μm. In some embodiments, along the extending direction of the short-side of the conductive pad 122 (e.g. the direction Y), the width Y2 of the buffer contact region Rb is approximately from 50 μm to 150 μm.

As shown in FIG. 21, for example, the buffer contact region Rb is sandwiched between the core contact region Rc and the testing region Rt, however the disclosure is not limited thereto. However, the disclosure is not limited thereto. In some embodiments, the testing region Rt is in contact with the buffer core region Rb, where the buffer contact region Rb is not sandwiched between an edge of the core contact region Rc and an edge of the testing region Rt, see FIG. 22 to FIG. 27.

Figure 22:
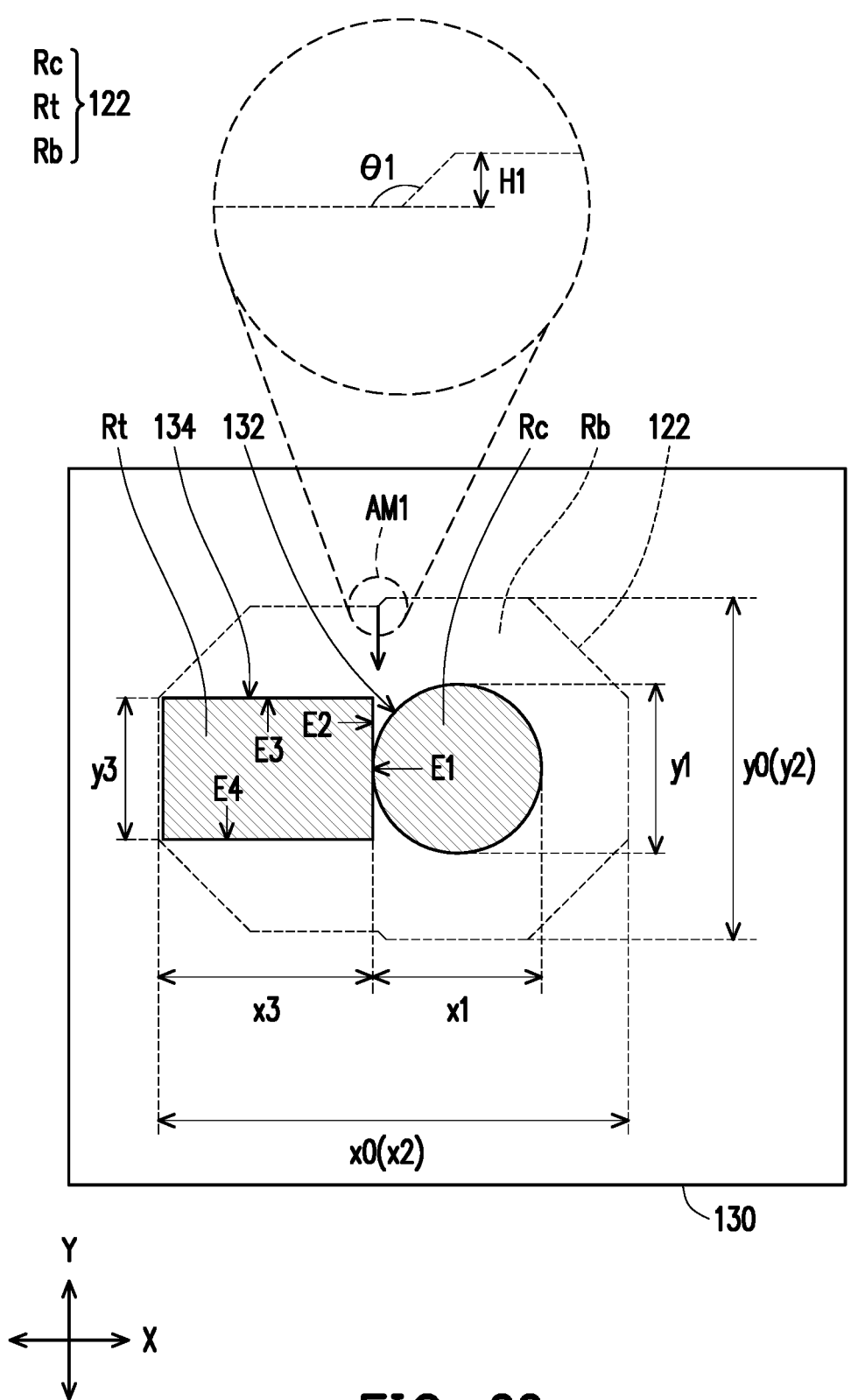

In one embodiment, referring to FIG. 21 and FIG. 22, the difference is that, for the conductive pad 122 depicted in FIG. 22, an edge E1 of the core contact region Rc is in contact with an edge E2 of the testing region Rt. For one example, the testing region Rt is elongated along the direction X to have the edge E2 in direct contact with the edge E1 of the core contact region Rc; owe to this, the length X3 of the testing region Rt is increased while maintaining the length X0 of the conductive pad 122, as shown in FIG. 22. In the embodiment of the elongated testing region, the reliability of the electrical circuit testing is ensured. The disclosure is not limited thereto. In an alternative embodiment, the testing region Rt may be pulled back towards the core contact region Rc to have the edge E2 in direct contact with the edge E1 of the core contact region Rc; owe to this configuration, the length X0 of the conductive pad 122 may be further reduced. In certain embodiments, as shown in FIG. 22, the conductive pad 122 further includes at least one alignment mark AM1 on an edge of the buffer contact region Rb, where the alignment mark AM1 is in form of a notch having a size H1 (measured on the direction Y) ranging from about 1 µm to about 10 µm and an include angle θ1 ranging from about 30 degrees to about 150 degrees. As shown in FIG. 22, in some embodiments, along the direction Y, the alignment mark AM1 is aligned with the edge E2 of the testing region Rt for indicating a positioning location of the testing region Rt.

Figure 23:
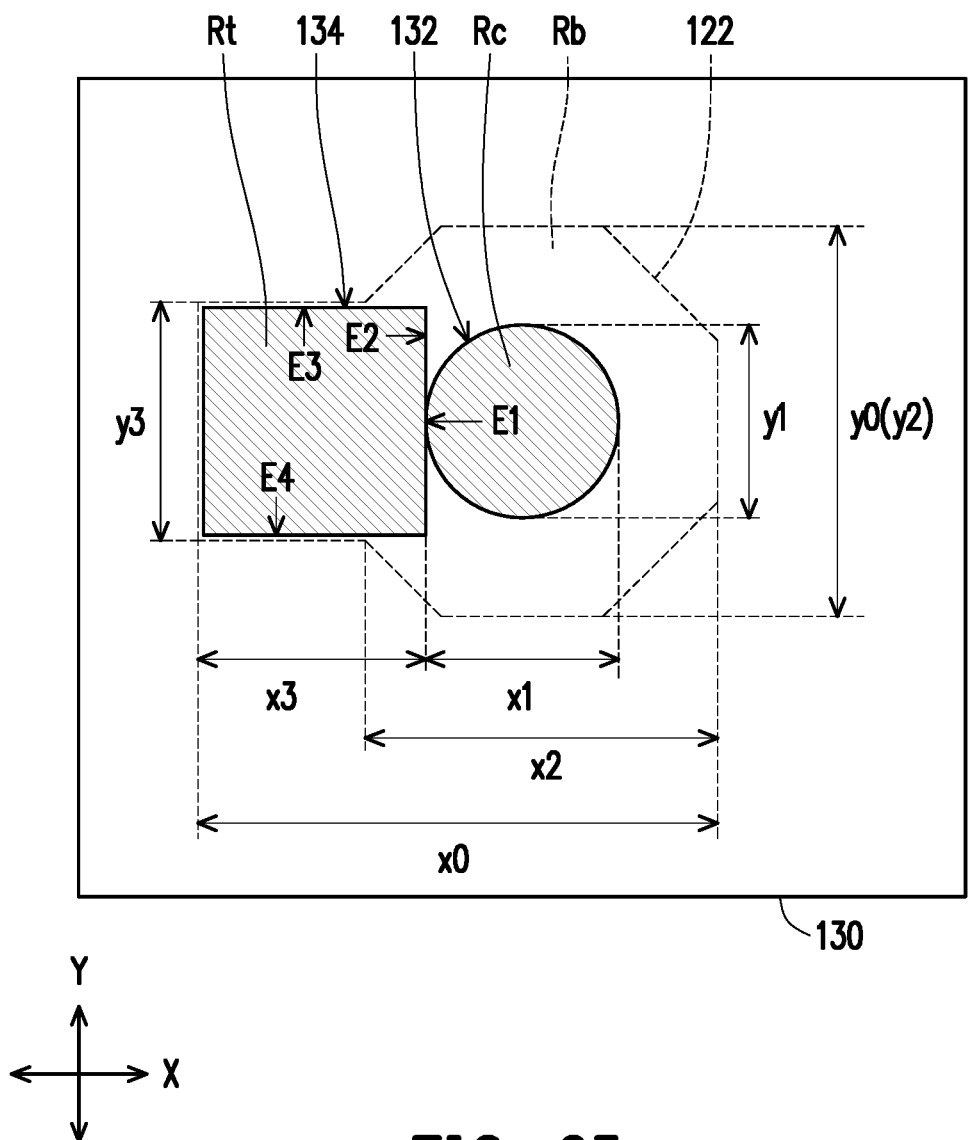

In one embodiment, referring to FIG. 22 and FIG. 23, the difference is that, for the conductive pad 122 depicted in FIG. 23, portions of the buffer contact region Rb contacting to two opposite edges E3, E4 of the testing region Rt are removed. In such embodiment, the positioning location of the testing region Rt is emphasized, and the alignment mark AM1 included in the conductive pad 122 depicted in FIG. 22 is omitted. Besides, owe to this configuration, a total area of the conductive pad 122 depicted in FIG. 23 is decreased, and the manufacturing cost can be reduced. However, the disclosure is not limited thereto. In some embodiments, the conductive pad 122 depicted in FIG. 23 may still include the alignment mark AM1 as shown in FIG. 22, if need.

Figure 24:
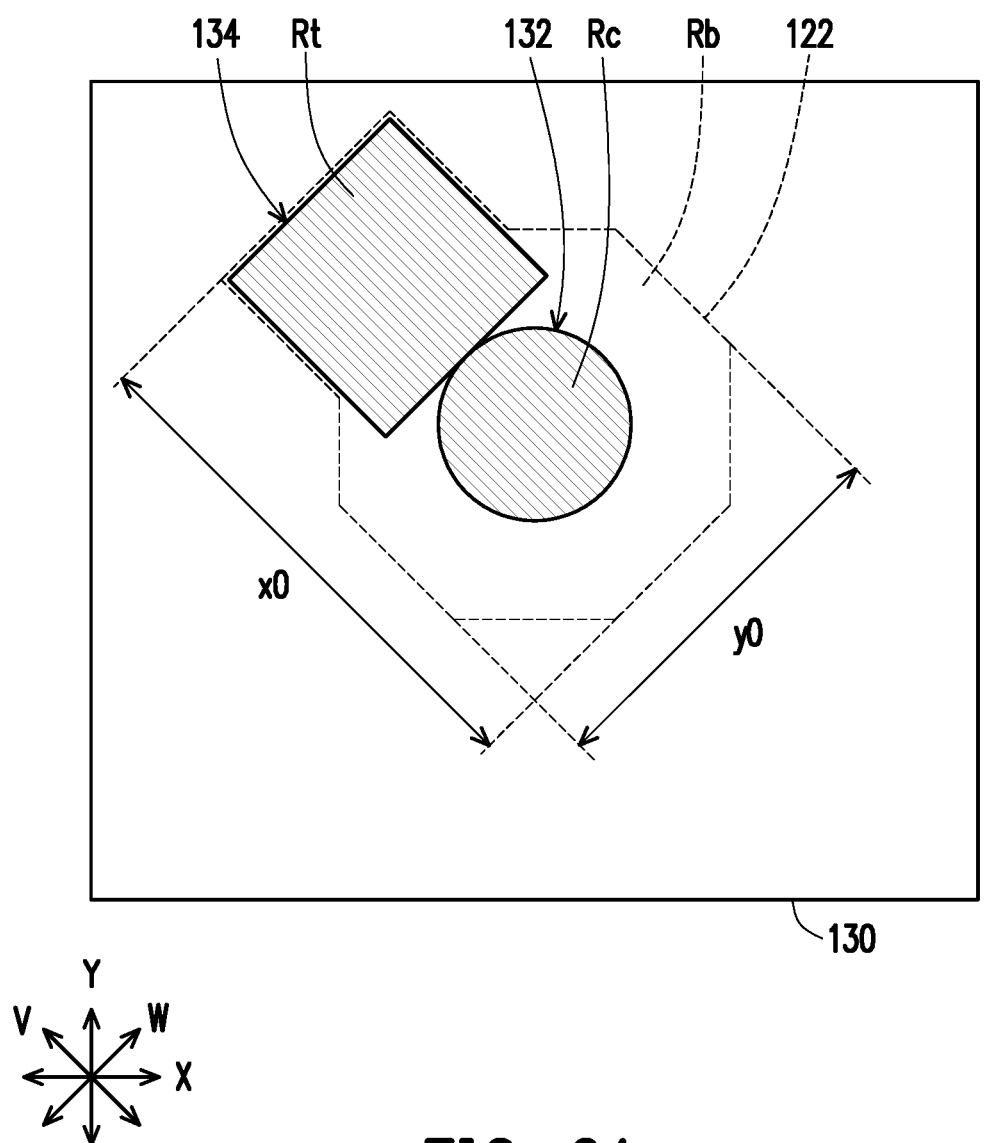

In one embodiment, referring to FIG. 23 and FIG. 24, the difference is that, for the conductive pad 122 depicted in FIG. 24, the conductive pad 122 is further rotated with a given degree ranging approximately from 30 degrees to 330 degrees. In some embodiments, the size SP (which measured from an edge of one conductive pad 122 to an edge of the immediately adjacent conductive pad 122) of the area between any two immediately adjacent conductive pads 122 having the orientation configuration depicted in FIG. 24 is increased. In other word, the size SP of the area between any two immediately adjacent conductive pads 122 having the orientation configuration depicted in FIG. 24 is greater than the size SP of the area between any two adjacent conductive pads 122 having the orientation configuration depicted in FIG. 23. In such embodiments, more conductive wirings 124 may be located between two immediately adjacent conductive pads 122 having the orientation configuration depicted in FIG. 24, thereby enhancing the routing function.

Figure 25:
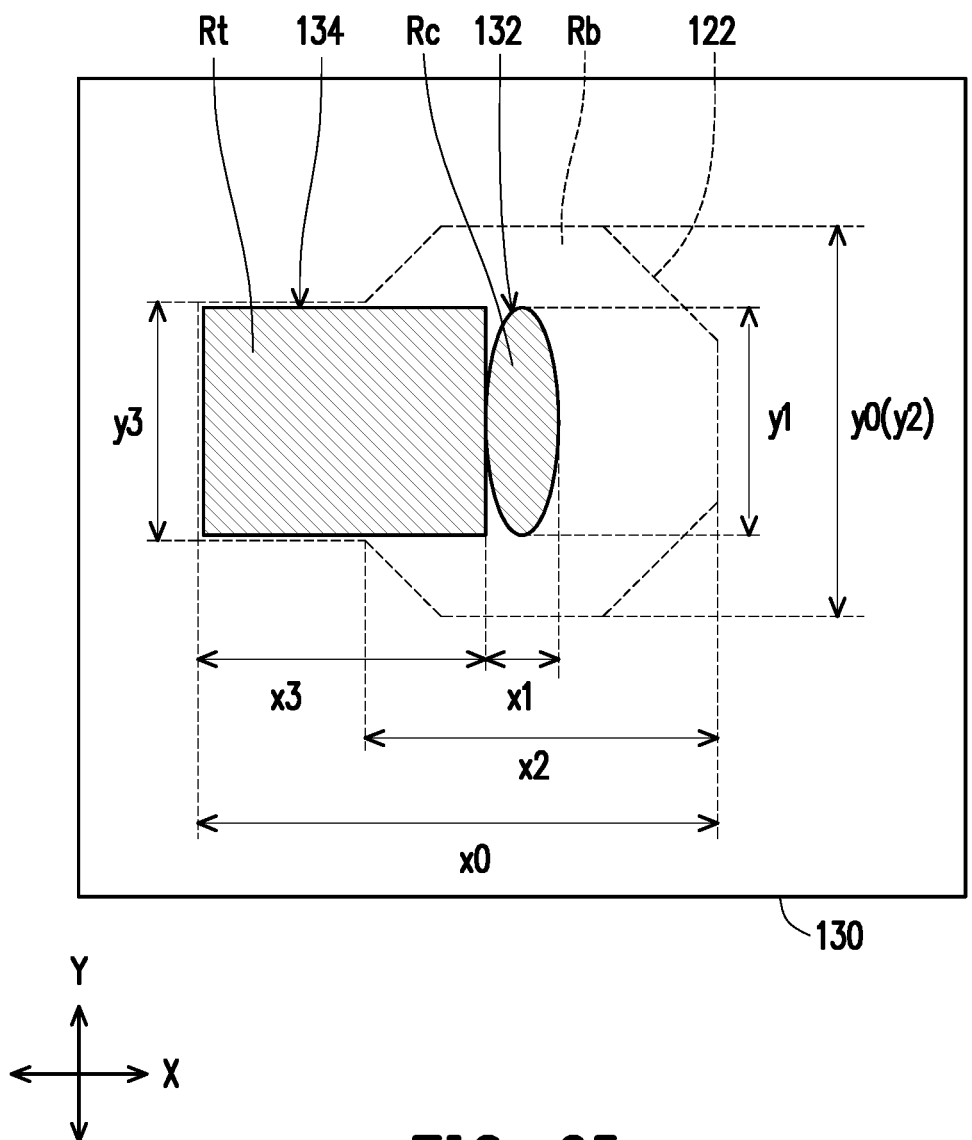

In one embodiment, referring to FIG. 23 and FIG. 25, the difference is that, for the conductive pad 122 depicted in FIG. 25, the core contact region Rc has a shape of oval. In some embodiments, the length X1 of the core contact region Rc of the conductive pad 122 depicted in FIG. 25 is reduced. For one example, the testing region Rt may be elongated along the direction X to maintain a direct contact with the core contact region Rc; owe to this, the length X3 of the testing region Rt is increased while maintaining the length X0 of the conductive pad 122, as shown in FIG. 25. In the embodiment of the elongated testing region, the reliability of the electrical circuit testing is ensured. The disclosure is not limited thereto. In an alternative embodiment, the testing region Rt may be pulled back towards the core contact region Rc to maintain a direct contact with the core contact region Rc; owe to this configuration, the length X0 of the conductive pad 122 may be further reduced.

Figure 26:
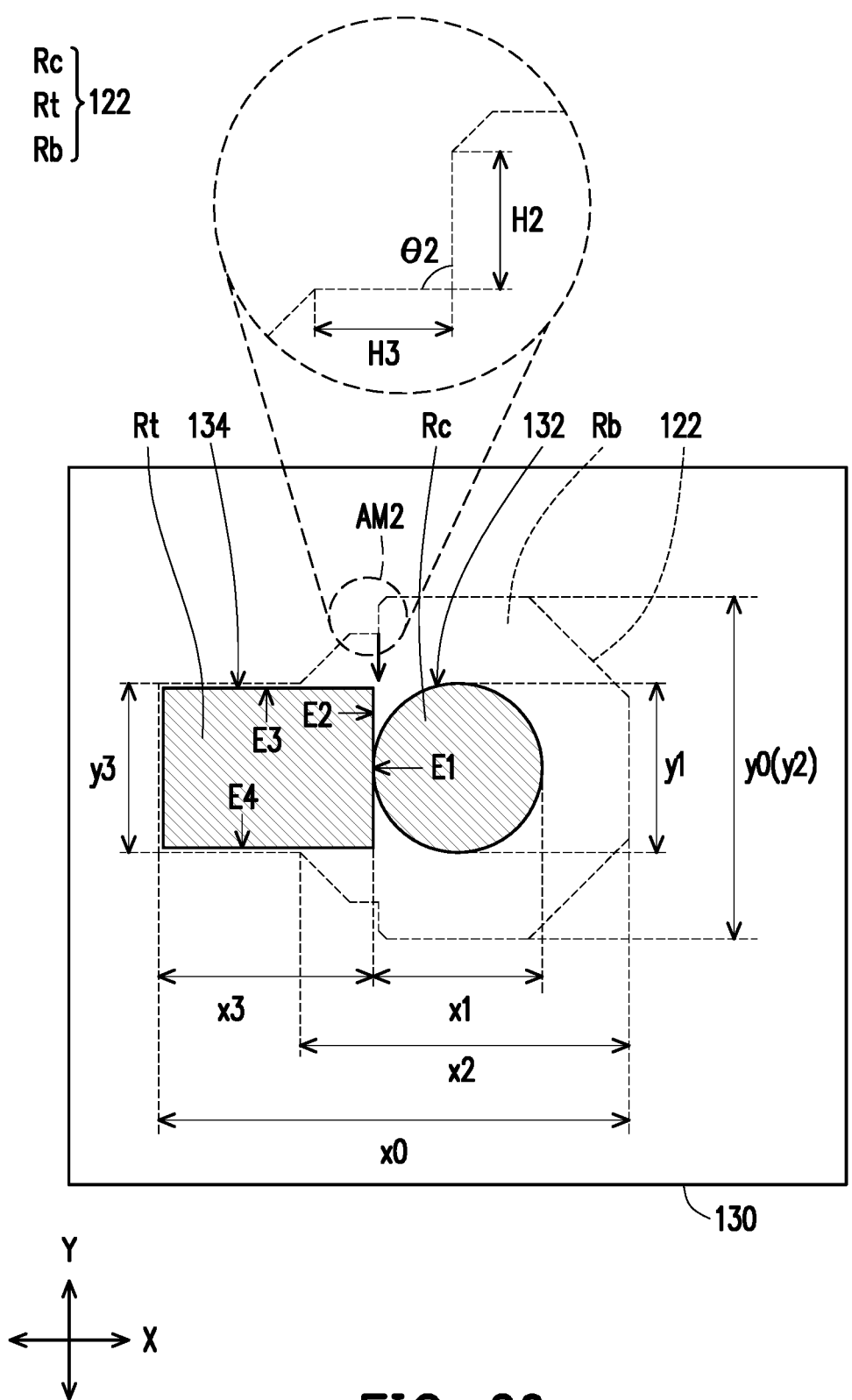

In one embodiment, referring to FIG. 22 and FIG. 26, the difference is that, for the conductive pad 122 depicted in FIG. 26, portions of the buffer contact region Rb contacting to the two opposite edges E3, E4 of the testing region Rt are removed. In such embodiment, the positioning location of the testing region Rt is further emphasized. Besides, owe to this configuration, a total area of the conductive pad 122 depicted in FIG. 26 is decreased, and the manufacturing cost can be reduced. However, the disclosure is not limited thereto. In certain embodiments, as shown in FIG. 26, the conductive pad 122 includes at least one alignment mark AM2 which acts a replacement of the alignment mark AM1 depicted in FIG. 22 on an edge of the buffer contact region Rb, where the alignment mark AM2 is in form of a L-shape notch having a size H2 (measured on the direction Y) ranging from about 1 µm to about 10 µm, a size H3 (measured on the direction X) ranging from about 1 µm to about 10 µm, and an included angle θ2 ranging from about 30 degrees to about 330 degrees. As shown in FIG. 26, in some embodiments, along the direction Y, the alignment mark AM2 is aligned with the edge E2 of the testing region Rt for indicating a positioning location of the testing region Rt.

Figure 27:
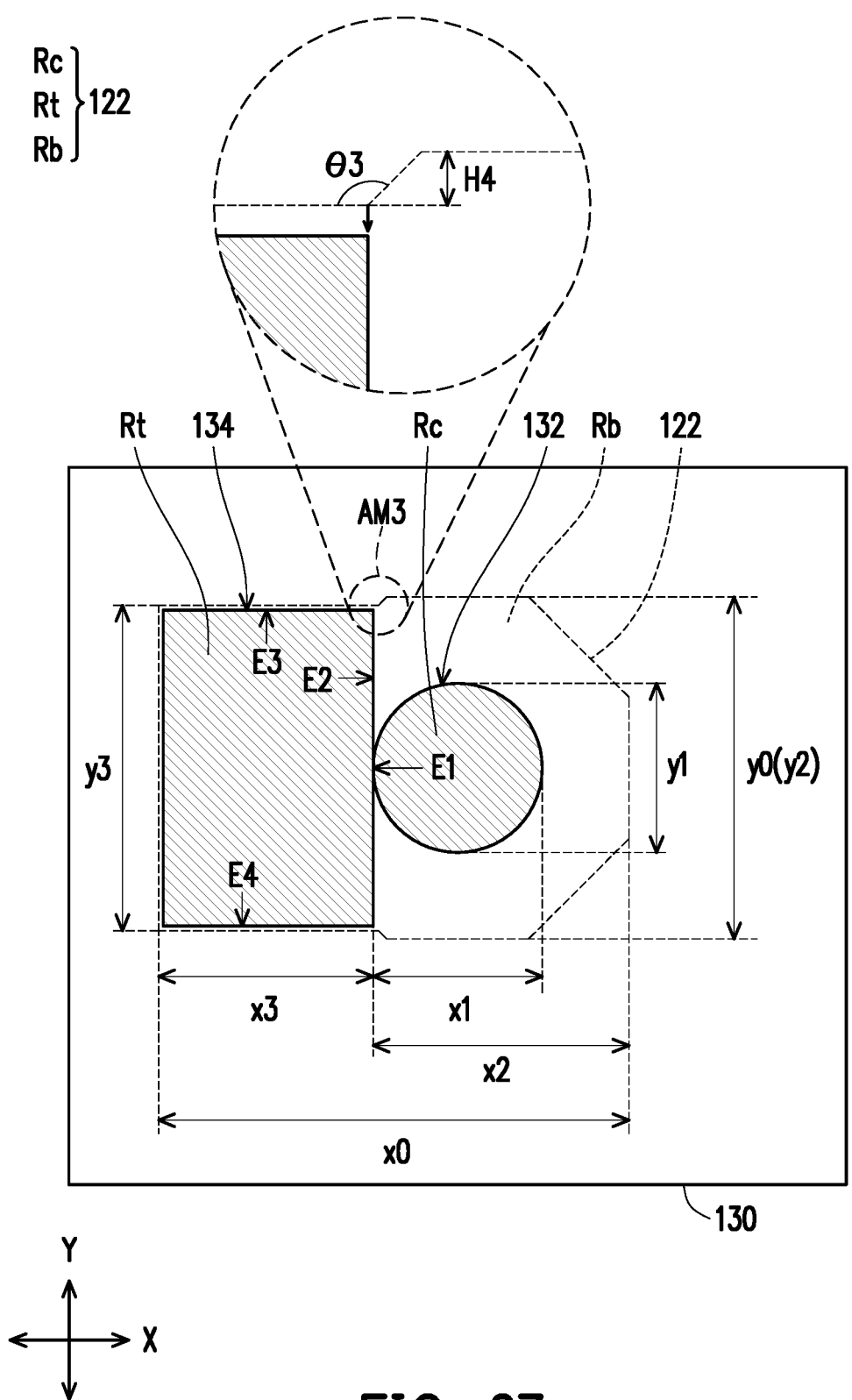

In one embodiment, referring to FIG. 22 and FIG. 27, the difference is that, for the conductive pad 122 depicted in FIG. 27, the conductive pad 122 include at least one alignment mark AM3 (e.g. a replacement of the alignment mark AM1 depicted in FIG. 22) on an edge of the buffer contact region Rb, where the alignment mark AM3 is in form of a notch having a size H4 (measured on the direction Y) ranging from about 1 µm to about 10 µm and an included angle θ3 ranging from about 30 degrees to about 330 degrees. As shown in FIG. 27, in some embodiments, along the direction Y, the alignment mark AM3 is aligned with the edge E2 of the testing region Rt for indicating a positioning location of the testing region Rt. In some embodiments, the testing region Rt is further elongated along the direction Y to have the edge E3 in direct contact with a first surface of the buffer contact region Rb and have the edge E4 in direct contact with a second surface of the buffer contact region Rb, where the first surface and the second surface of the buffer contact region Rb are opposite to each other. In such embodiment, the width Y0 of the conductive pad 122 is substantially equal to a sum of the width Y3 of the testing region Rt and the size H4 of the notch, and a total area of the testing region Rt is increased. In the embodiment of the elongated testing region, the reliability of the electrical circuit testing is ensured.

In the disclosure, the length X0 of the conductive pad 122 is less than a sum of the length X3 of the testing region Rt and the length X2 of the buffer contact region Rb, as shown in FIG. 21 to FIG. 27. In addition, in some embodiments, the conductive pad 122 of each of FIG. 21 to FIG. 27 may further include the alignment mark AM1 as shown in FIG. 22, the alignment mark AM2 in FIG. 26 or the alignment mark AM3 in FIG. 27, or may replace the original alignment mark with another one of the alignment mark AM1 as shown in FIG. 22, the alignment mark AM2 in FIG. 26 or the alignment mark AM3 in FIG. 27, if need. The numbers of the alignment mark may be more than one based on the demand, and is not limited to the embodiments.

Referring back to FIG. 1, in some embodiments, the passivation layer 130 formed on the conductive layer 120 may be a silicon oxide layer, a silicon nitride layer, a silicon oxy-nitride layer or a dielectric layer formed by other suitable dielectric materials, and may be formed by deposition, such as chemical vapor deposition (CVD), plasma-enhanced chemical vapor deposition (PECVD) or the like. The disclosure is not limited thereto.

Figure 2:
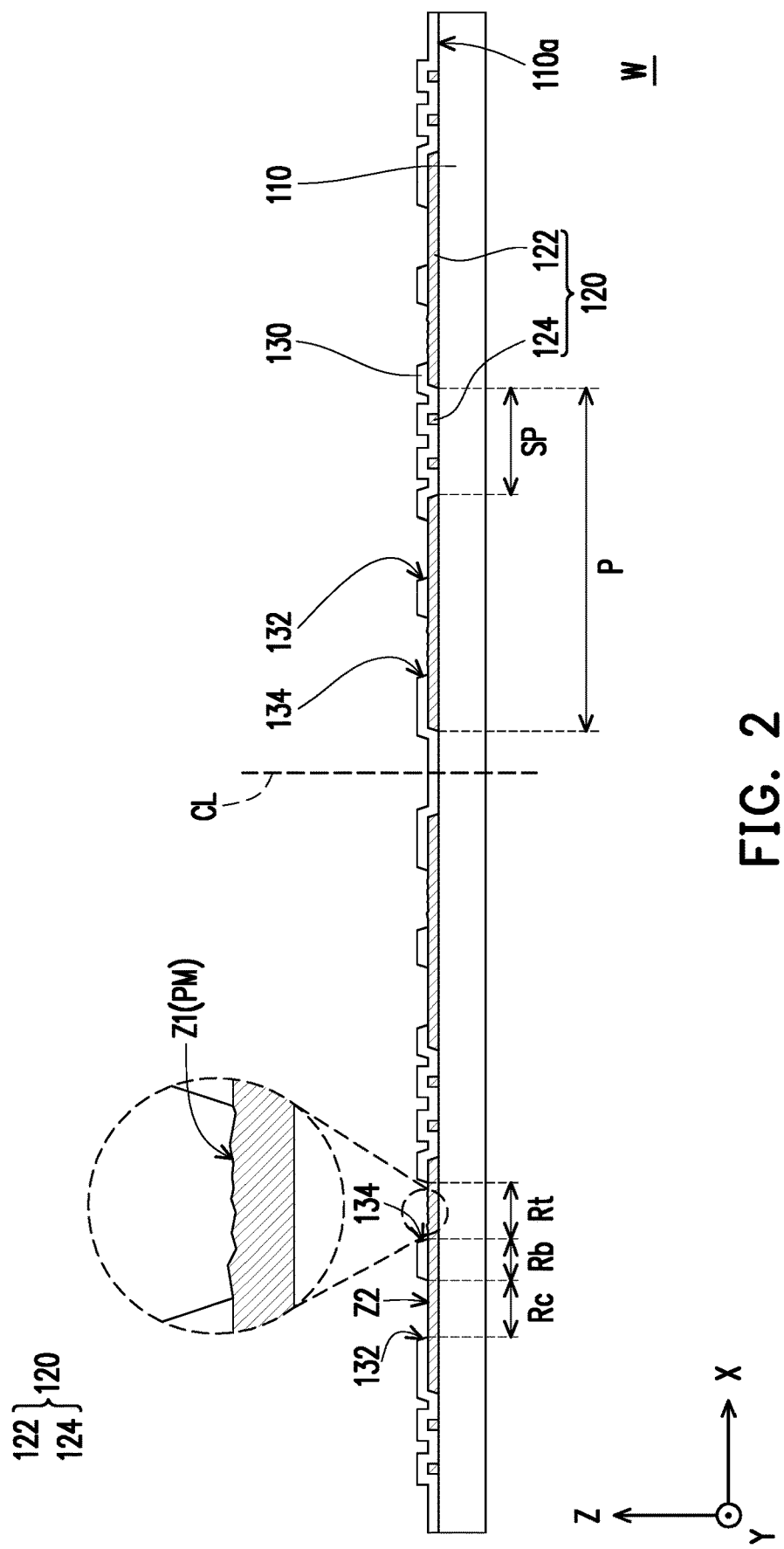

Referring to FIG. 2, in some embodiments, an electrical circuit testing is performed to the testing region Rt of at least one of the conductive pads 122 of each integrated circuit component, and a surface Z1 of the testing region Rt after performing the electrical circuit testing has a probe mark PM. In some embodiments, the surface Z1 of the testing region Rt having the probe mark PM has a non-planar surface, as shown in FIG. 2. In certain embodiments, for one conduct pad 122, a surface roughness of the surface Z1 of the testing region Rt having the probe mark PM is greater than a surface Z2 of the contact region Rc. For example, the surface roughness of the surface Z1 of the testing region Rt having the probe mark PM may range from about 0.1 μm to about 2 μm. The electrical circuit testing, for example, may include a wafer acceptable test (WAT) and/or a circuit probing(CP) test; however, the disclosure is not limited thereto.

Figure 3:
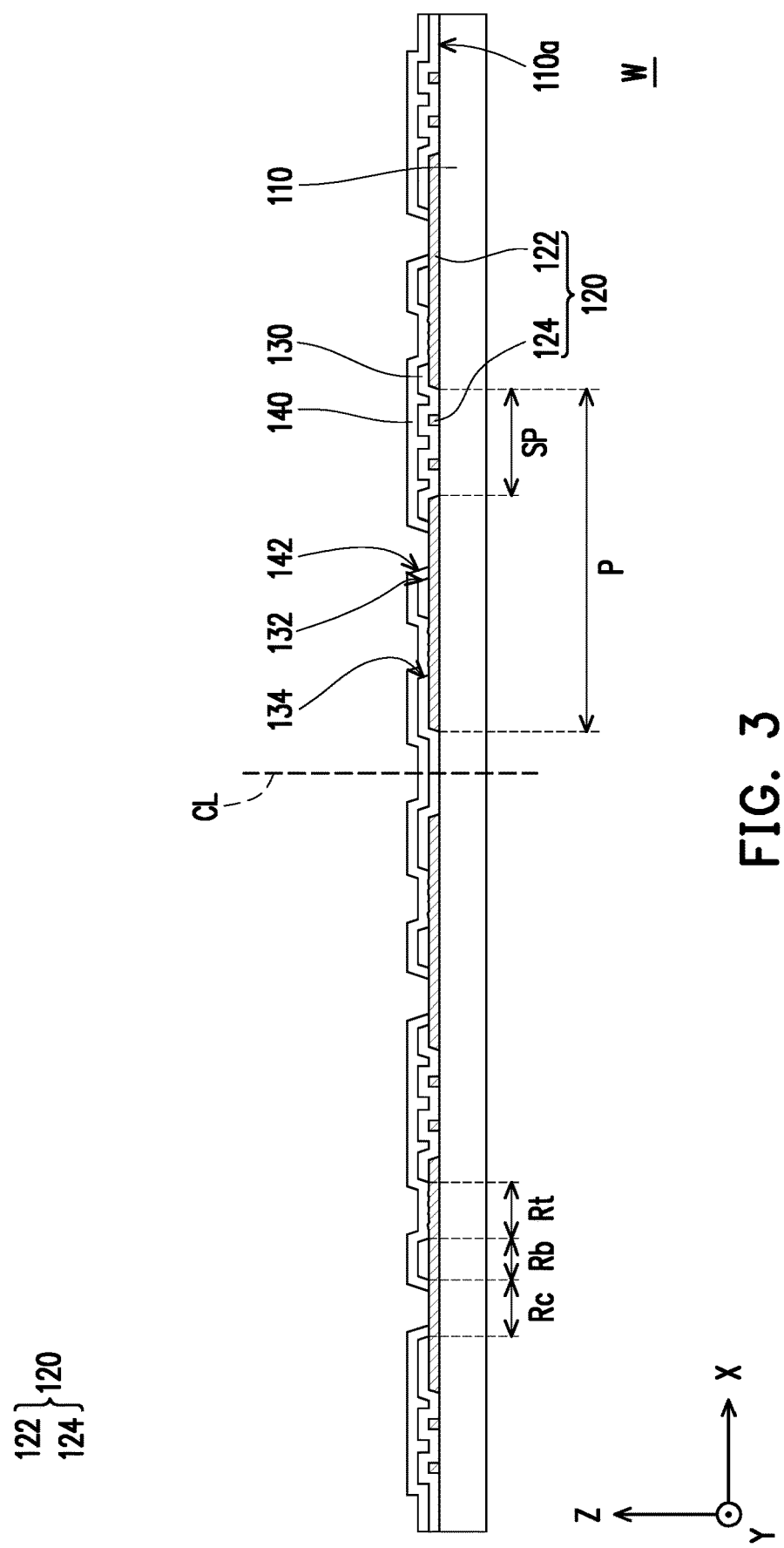

Referring to FIG. 3, in some embodiments, after the electrical circuit testing is performed, a post-passivation layer 140 is formed on the passivation layer 130. As shown on FIG. 3, the post-passivation layer 140 covers the passivation layer 130 and has a plurality of openings 142 exposing the conductive pads 120 exposed by the openings 132. In other words, the post-passivation layer 140 covers the testing region Rt, and exposes the core contact region Rc through the openings 142. In some embodiments, portions of the conductive pads 120 exposed by the openings 132 of the passivation layer 130 are partially covered by the post-passivation layer 140. In other words, the conductive pads 120 are partially exposed by the openings 142 of the post-passivation layer 140, respectively. For example, in some embodiments, the post-passivation layer 140 may be a polyimide (PI) layer, a polybenzoxazole (PBO) layer, or a dielectric layer formed by other suitable polymers, and may be formed by spin-coating or deposition.

Figure 4:
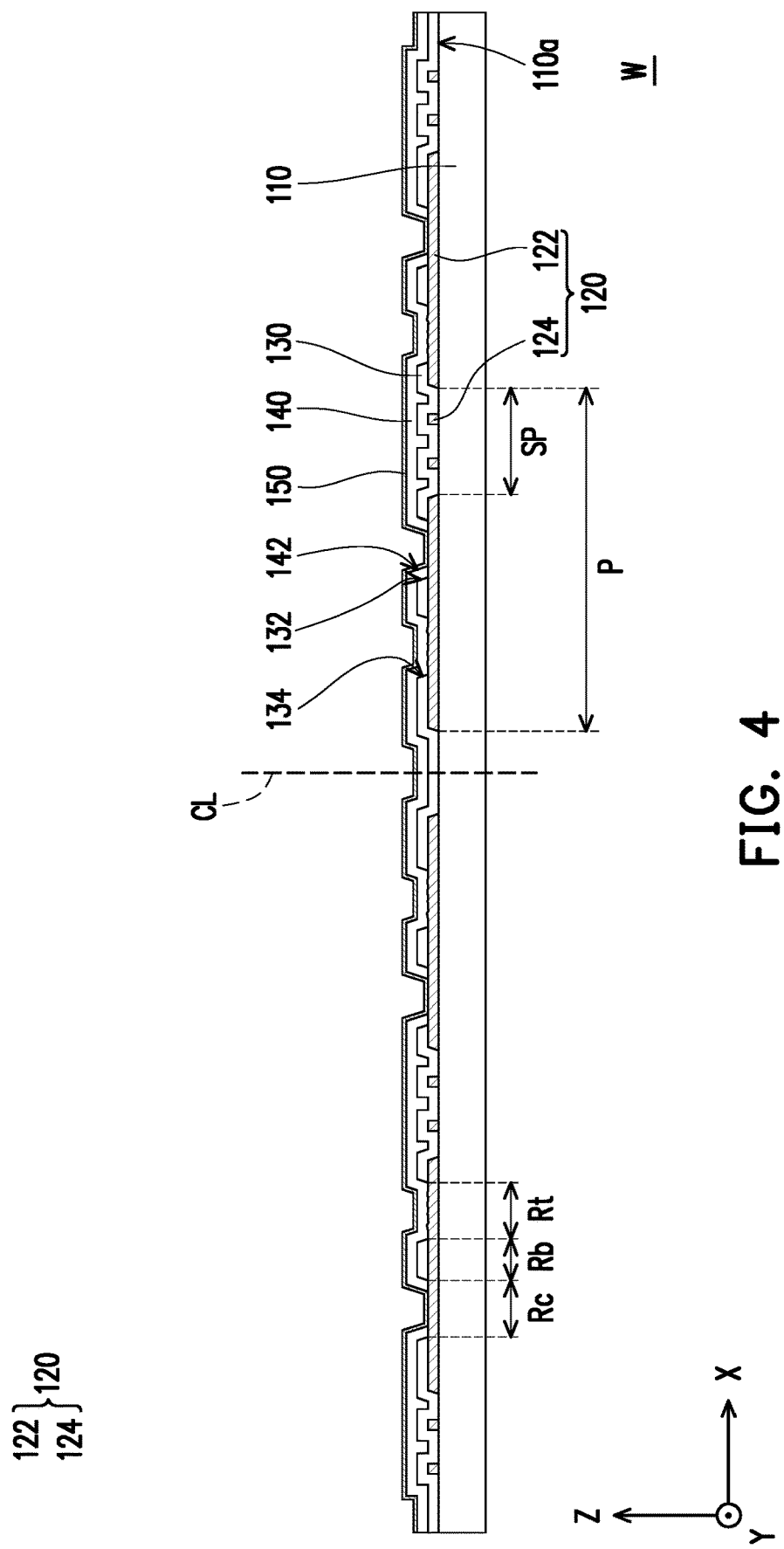

Referring to FIG. 4, in some embodiments, a seed layer 150 is formed over the semiconductor substrate 110 and on the post-passivation layer 140. For example, the seed layer 150 is formed on the post-passivation layer 140 to cover the post-passivation layer 140 and the conductive layer 120 exposed by the post-passivation 140 and by the passivation layer 130 (e.g. the core contact region Rc). In certain embodiments, the seed layer 150 extends into the openings 142 formed in the post-passivation layer 140 and the openings 123 formed in the passivation layer 130 and in contact with the core contact region Rc exposed by the openings 142 and the openings 132. In other words, a portion of the seed layer 150 penetrates through the post-passivation layer 140 and the passivation layer 130, and physically contacts the conductive layer 120, where sidewalls of the openings 142 and the openings 132 are completely covered by the seed layer 150. In some embodiments, the seed layer 150 is formed over the semiconductor substrate 110 in a manner of a blanket layer made of metal or metal alloy materials, the disclosure is not limited thereto. In some embodiments, the seed layer 150 are referred as a metal layer, which may be a single layer or a composite layer comprising a plurality of sub-layers formed of different materials. In some embodiments, the seed layer 150 may include titanium, copper, molybdenum, tungsten, titanium nitride, titanium tungsten, combinations thereof, or the like. For example, the seed layer 150 may include a titanium layer and a copper layer over the titanium layer. The seed layer 150 may be formed using, for example, sputtering, physical vapor deposition (PVD). or the like. For example, the seed layer 150 is conformally formed on the post-passivation layer 140 by sputtering, and is in contact with the conductive pads 122 of conductive layer 120 exposed by the post-passivation layer 140 and the passivation layer 130.

Figure 5:
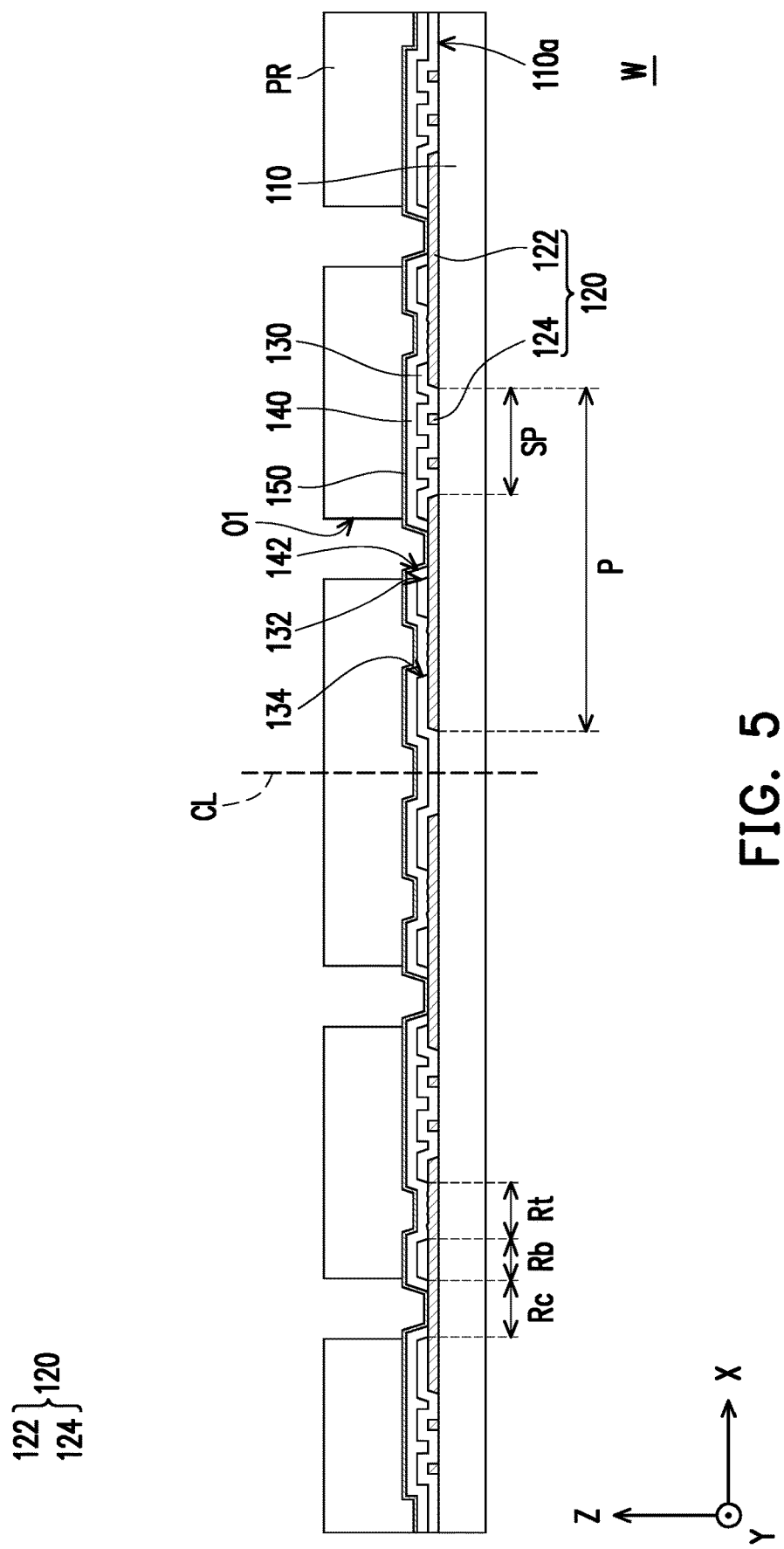

Referring to FIG. 5, in some embodiments, a patterned photoresist layer PR is formed over the semiconductor substrate 110 and on the seed layer 150, wherein the patterned photoresist layer PR includes at least one opening O1. In some embodiments, as shown in FIG. 5, a plurality of openings O1 are formed in the patterned photoresist layer PR, where positioning locations of the openings O1 are corresponding to positioning locations of the core contact regions Rc of the conductive pads 122, respectively. In one embodiment, the patterned photoresist layer PR may be formed by coating and photolithography processes or the like. The number of the openings O1 may, for example, correspond to the number of later-formed conductive structure(s) (such as a conductive pillar or conductive via). However, the disclosure is not limited thereto. In some embodiments, a material of the patterned photoresist layer PR, for example, includes a positive resist material or a negative resist material, that is suitable for a patterning process such as a photolithography process with a mask or a mask-less photolithography process (for instance, an electron-beam (e-beam) writing or an ion-beam writing). As shown in FIG. 5, portions of the seed layer 150 corresponding to the positioning locations of the core contact regions Rc are exposed by the openings O1 formed in the patterned photoresist layer PR, respectively.

Figure 6:
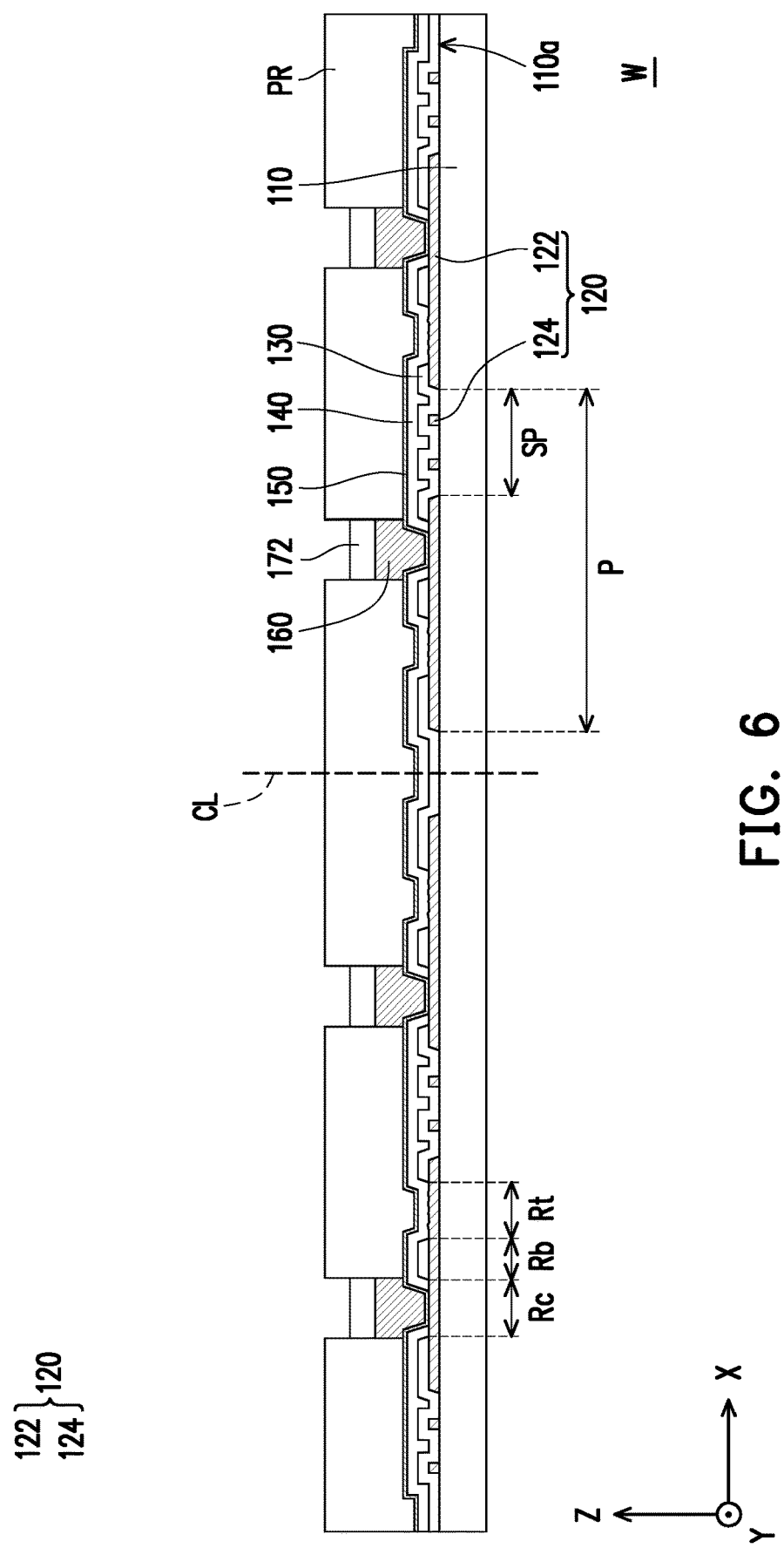

Referring to FIG. 6, in some embodiments, conductive pillars 160 are formed in the openings O1, respectively. In some embodiments, a conductive material (not shown) is deposited onto the exposed seed layer 150 to form the conductive pillars 160. Subsequently, a solder material 170 is deposited onto the conductive pillars 160. The conductive pillars 160 and the solder material 170 are located within the openings O1 of the patterned photoresist layer PR. In other words, the conductive pillars 160 and the solder material 170 are formed using the patterned photoresist layer PR as a mask. In some embodiments, the conductive material and the solder material 170 may be formed by a plating process. The plating process is, for example, electro-plating, electroless-plating, immersion plating, or the like. In some embodiments, the conductive material includes, for example, copper, copper alloys, or the like. For simplification, only two conductive pillars 160 are presented in each integrated circuit component as shown in FIG. 6 for illustrative purposes, however, it should be noted that more than two conductive pillars may be formed; the disclosure is not limited thereto. The number of the conductive pillars can be selected based on the demand.

Figure 7:
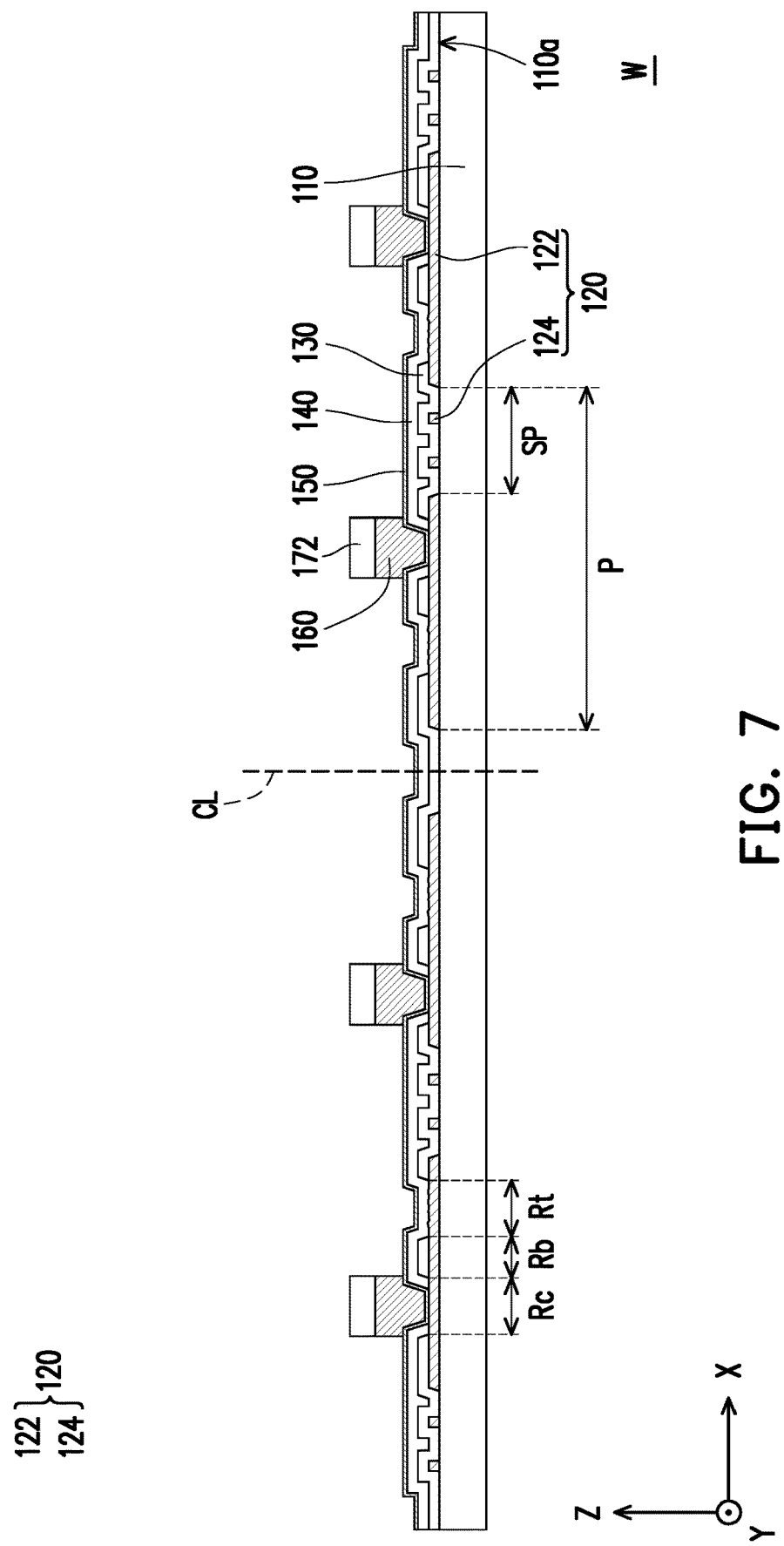

Referring to FIG. 7, in some embodiments, the patterned photoresist layer PR is removed, where portions of the seed layer 150, which are not covered by the conductive pillars 160 and the solder material 170, are exposed. The patterned photoresist layer PR may be removed and/or stripped through, for example, etching, ashing, or other suitable removal processes. The disclosure is not limited thereto.

Figure 8:
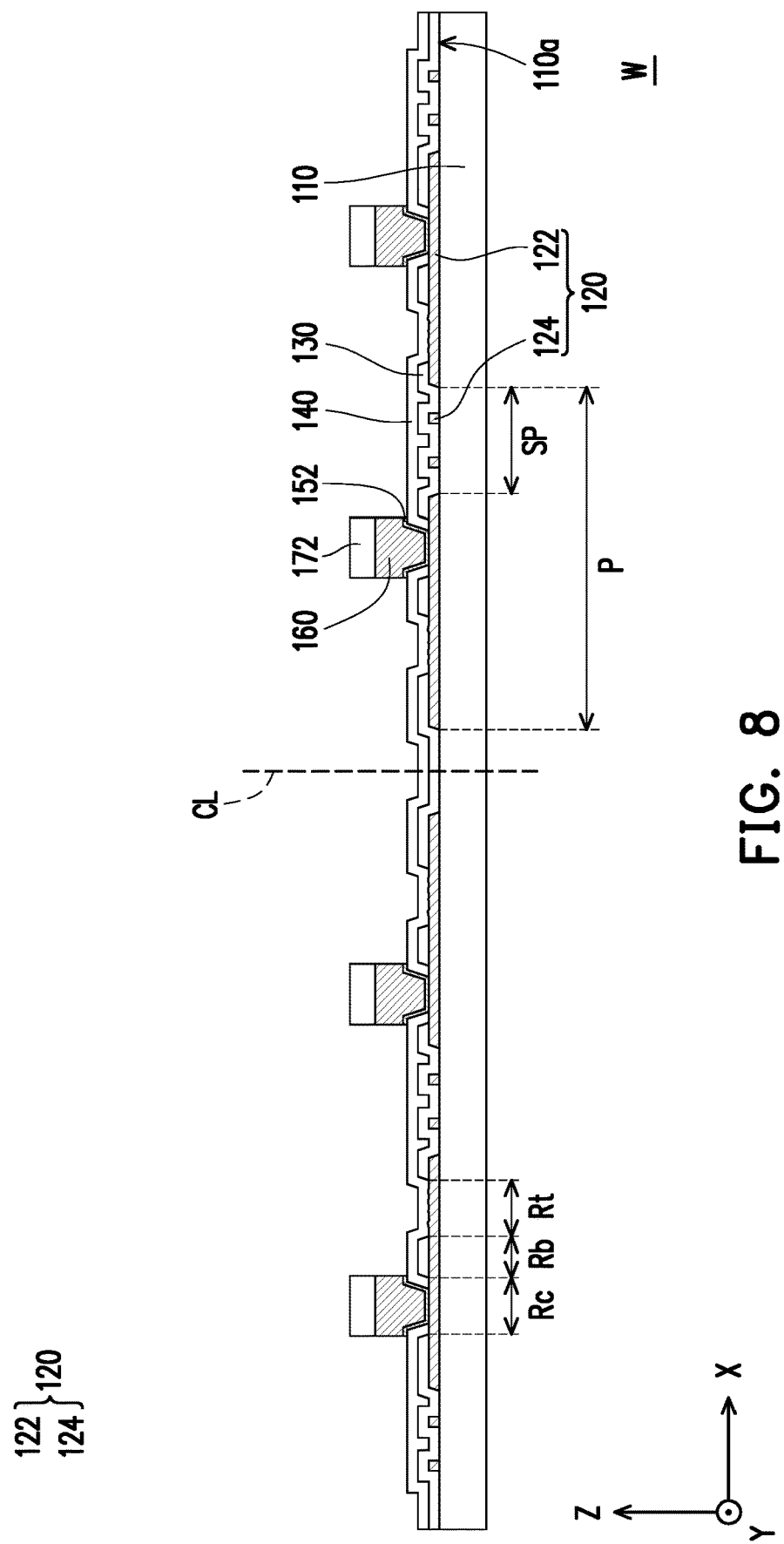

Referring to FIG. 8, the seed layer 150 that is not covered by the conductive pillars 160 and the solder material 170 is removed to render a seed layer 152 sandwiched between the conductive pillars 160 and the post-passivation layer 140. The exposed portions of the seed layer 150 may be removed through an etching process. In some embodiments, the material of the conductive pillars 160 may be different from the material of the seed layer 150, so the exposed portion of the seed layer 150 may be removed through selective etching.

Figure 9:
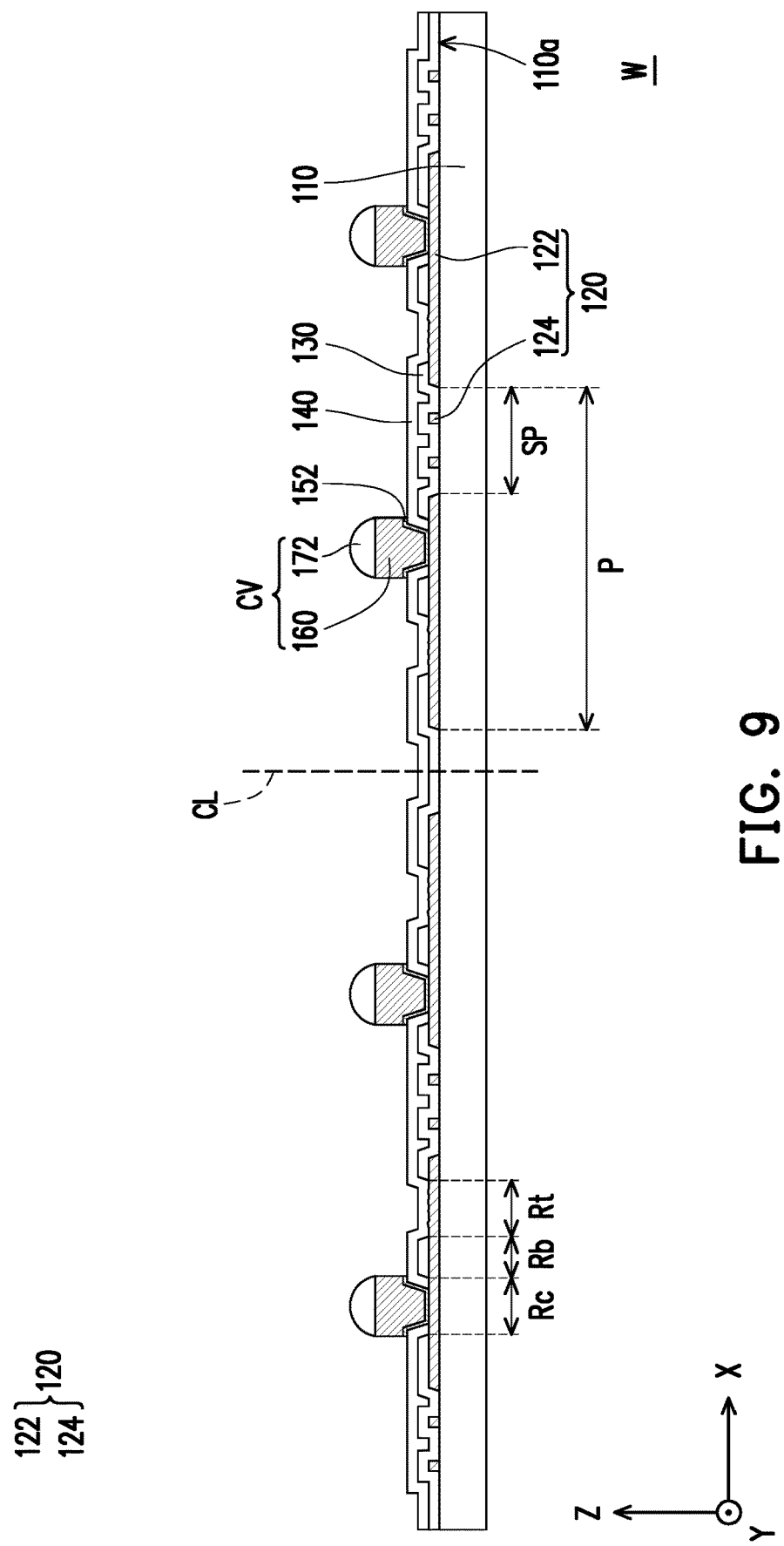

Referring to FIG. 9, in some embodiments, a reflow process is performed on the solder material 170 to transform the solder material 170 into conductive bumps 172. As illustrated in FIG. 9, the conductive bumps 172 after the reflow process exhibits a hemispherical shape. However, the disclosure is not limited thereto. In some alternative embodiments, the conductive bumps 172 may take other forms after the reflow process. In the embodiments, one conductive pillar 160 and one conductive bump 172 together are referred to as one conductive via CV.

Figure 10:
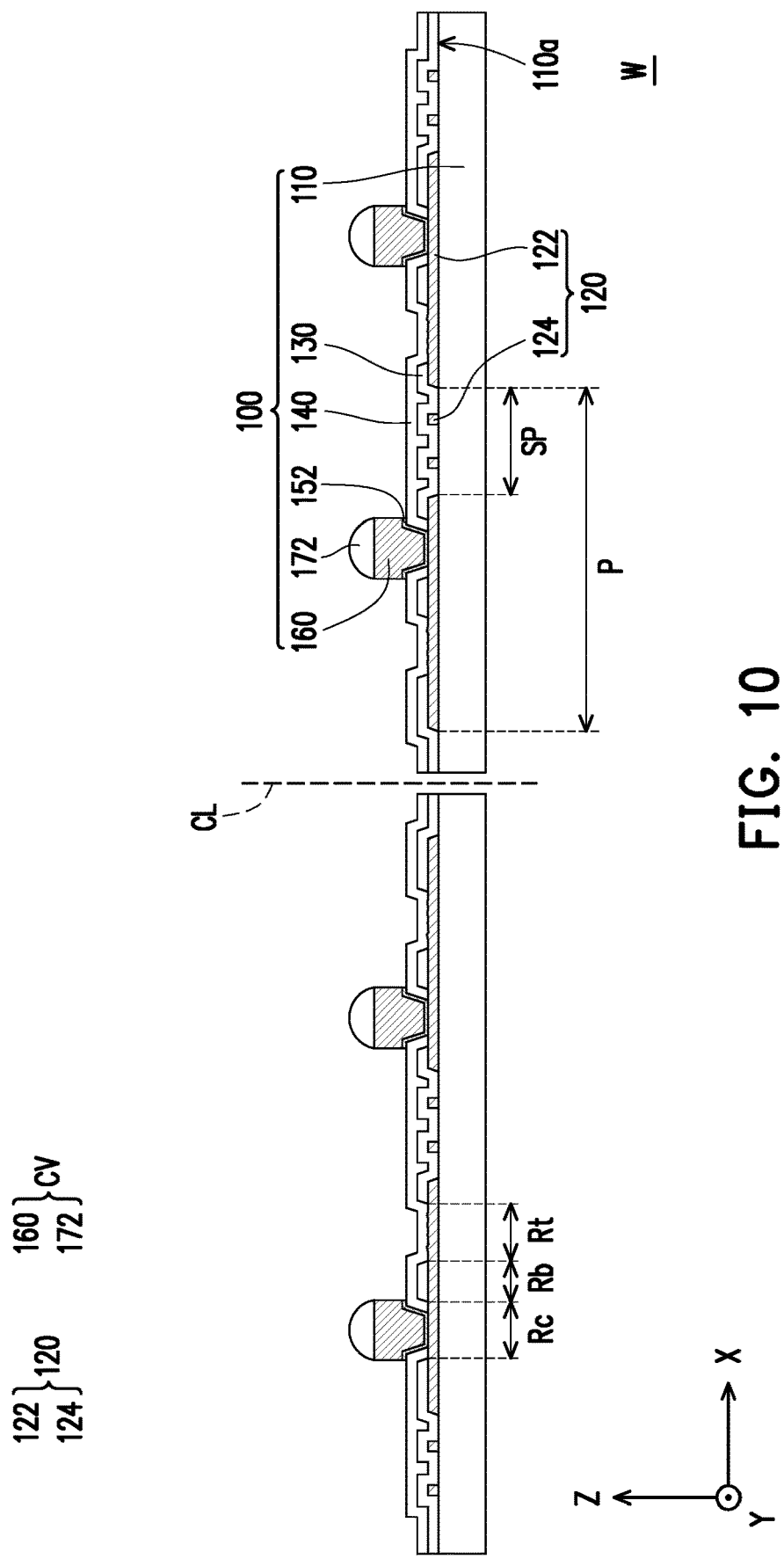

Referring to FIG. 10, in some embodiments, a dicing process (e.g., singulation) is performed to cut the wafer W, such that the wafer W having a plurality integrated circuit components 100 connected therebetween is cut into singulated and separate integrated circuit components 100. In some embodiments, the dicing process may include a wafer dicing process. Up to this, the integrated circuit components 100 are manufactured.

FIG. 11 to FIG. 14 are schematic cross sectional views of various stages in a manufacturing method of a package structure in accordance with some embodiments of the disclosure. In embodiments, the manufacturing method is part of a wafer level packaging process. In FIG. 11 to FIG. 14, one integrated circuit components 100 are shown to represent the number of the integrated circuit component 100 included in a package structure 10, for example. However, the disclosure is not limited thereto, and one or more than one integrated circuit components 100 may be included in the package structure 10.

Figure 11:
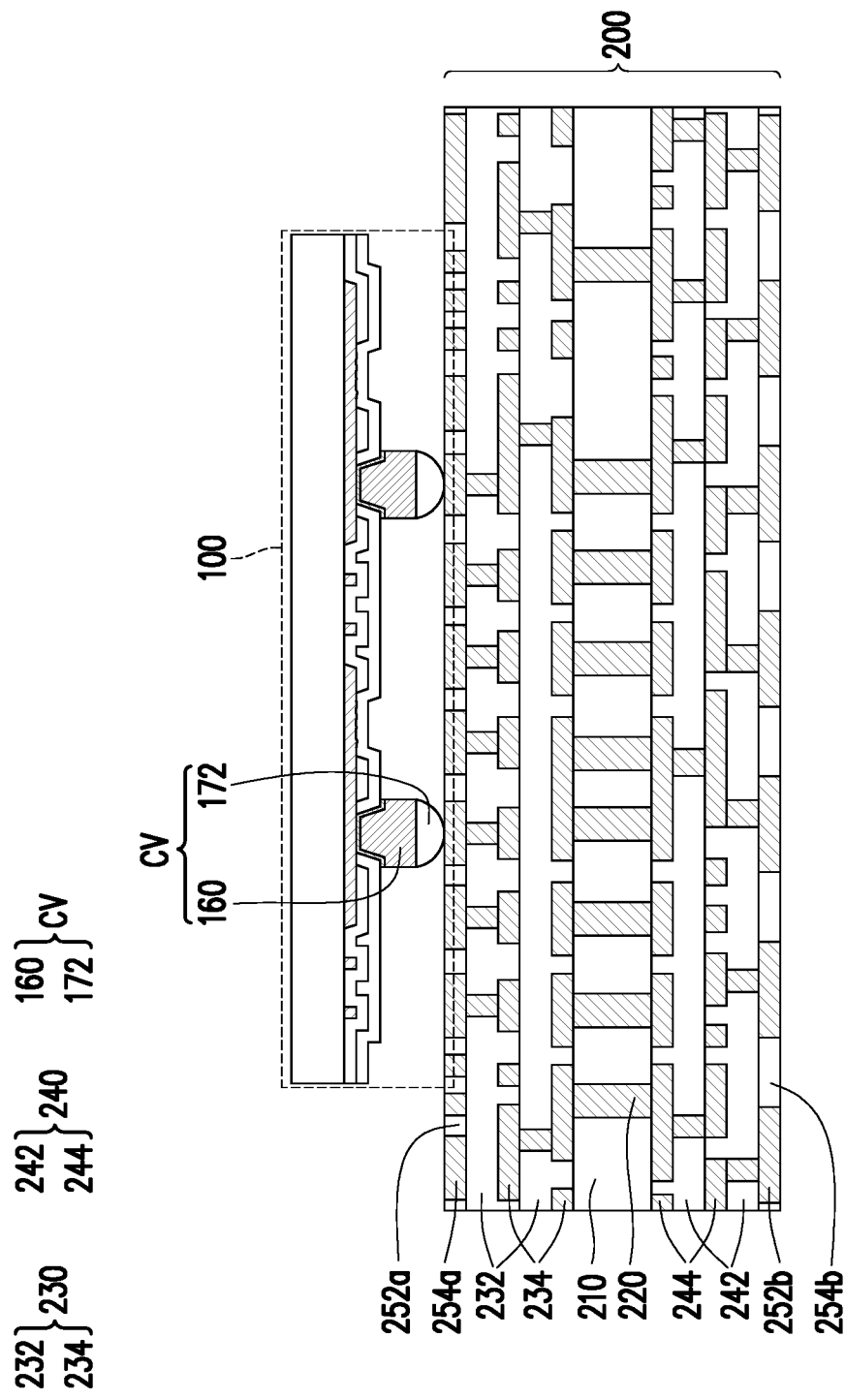
FIG. 11 to FIG. 14 are schematic cross sectional views of various stages in a manufacturing method of a package structure in accordance with some embodiments of the disclosure.

Referring to FIG. 11, in some embodiments, a carrier substrate 200 is provided. As shown in FIG. 11, for example, the carrier substrate 200 has a substructure 210, a plurality of through vias 220, a redistribution circuit structure 230, a redistribution circuit structure 240, a plurality of bonding pads 252a, a plurality of bonding pads 254b, a solder mask layer 254a, and a solder mask layer 245b.

In some embodiments, the substrate 210 may include a substrate including active devices (e.g., transistors and/or memories such as N-type metal oxide semiconductor (NMOS) and/or p-type metal oxide semiconductor (PMOS) devices, or the like) and/or passive devices (e.g., resistors, capacitors, inductors or the like) formed therein. In some embodiments, the above substrate may be a bulk silicon substrate, such as a bulk substrate of monocrystalline silicon, a doped silicon substrate, an undoped silicon substrate, or a SOI substrate, where the dopant of the doped silicon substrate may be an N-type dopant, a P-type dopant or a combination thereof. The disclosure is not limited thereto.

In some embodiments, the redistribution circuit structure 230 and the redistribution circuit structure 240 respectively disposed on two opposite sides of the substrate 210, as shown in FIG. 11. In some embodiments, the redistribution circuit structure 230 and/or the redistribution circuit structure 240 are electrically connected to the substrate 210 (e.g. the active and/or passive device embedded therein). In certain embodiments, the redistribution circuit structure 230 includes sequentially forming one or more dielectric layers 232 and one or more metallization layers 234 in alternation, where one metallization layer 234 is sandwiched between two dielectric layers 232. As shown in FIG. 11, portions of a top surface of a topmost layer of the metallization layers 234 are respectively exposed by openings formed in a topmost layer of the dielectric layers 232, and portions of a bottom surface of a bottommost layer of the metallization layers 234 are respectively exposed by openings formed in a bottommost layer of the dielectric layers 232. However, the disclosure is not limited thereto. The numbers of the metallization layers and the dielectric layers included in the redistribution circuit structure 230 is not limited thereto, and may be designated and selected based on the demand. Similarly, the redistribution circuit structure 240 includes sequentially forming one or more dielectric layers 242 and one or more metallization layers 244 in alternation, where one metallization layer 244 is sandwiched between two dielectric layers 242. As shown in FIG. 11, portions of a top surface of a topmost layer of the metallization layers 244 are respectively exposed by openings formed in a topmost layer of the dielectric layers 242, and portions of a bottom surface of a bottommost layer of the metallization layers 244 are respectively exposed by openings formed in a bottommost layer of the dielectric layers 242. However, the disclosure is not limited thereto. The numbers of the metallization layers and the dielectric layers included in the redistribution circuit structure 240 is not limited thereto, and may be designated and selected based on the demand. As shown in FIG. 11, the substrate 210 is located between the redistribution circuit structure 230 and the redistribution circuit structure 240, in some embodiments.

In certain embodiments, the material of the dielectric layers 232, 242 may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers 232, 242 formed by suitable fabrication techniques such as spin-on coating, chemical vapor deposition (CVD), plasma-enhanced chemical vapor deposition (PECVD) or the like. The disclosure is not limited thereto. In one embodiment, the materials of the dielectric layers 232 and the dielectric layers 242 may be the same. In an alternative embodiment, the materials of the dielectric layers 232 and the dielectric layers 242 may be different.

In certain embodiments, the material of the metallization layers 234, 244 may be made of conductive materials formed by electroplating or deposition, such as aluminum, titanium, copper, nickel, tungsten, and/or alloys thereof, which may be patterned using a photolithography and etching process. In some embodiments, the metallization layers 234, 244 may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. In one embodiment, the materials of the metallization layers 234 and the metallization layers 244 may be the same. In an alternative embodiment, the materials of the metallization layers 234 and the metallization layers 244 may be different.

In some embodiments, the through vias 220 penetrate through the substrate 210, where one end of the through vias 220 is connected to the portions of the bottom surface of the bottommost layer of the metallization layers 244 exposed by the openings formed in the bottommost layer of the dielectric layers 242, and other one end of the through vias 220 is connected to the portions of the top surface of the topmost layer of the metallization layers 244 exposed by the openings formed in the topmost layer of the dielectric layers 242. Through the through vias 220, the redistribution circuit structure 230 and the redistribution circuit structure 240 are electrically connected to each other. In other words, the through vias 220 are electrically connected to the substrate 210 through the redistribution circuit structure 230 and/or the redistribution circuit structure 240. For example, the through vias 220 may be through-silicon-vias (TSVs). The material of the through vias 220, for example, may include copper, copper alloy, or the like. The disclosure is not limited thereto.

In some embodiments, the bonding pads 254*a* are disposed on a surface of the redistribution circuit structure 230 and physically connected to the portions of the top surface of the topmost layer of the metallization layers 234 exposed by the openings formed in the topmost layer of the dielectric layers 232, where the bonding pads 254*a* are physically separated from each other through the solder mask layer 252*a* formed on the surface of the redistribution circuit structure 230 with the bonding pads 254*a* disposed thereon. Similarly, the bonding pads 254*b* are disposed on a surface of the redistribution circuit structure 240 and physically connected to the portions of the bottom surface of the bottommost layer of the metallization layers 244 exposed by the openings formed in the bottommost layer of the dielectric layers 242, where the bonding pads 254*b* are physically separated from each other through the solder mask layer 252*b* formed on the surface of the redistribution circuit structure 240 with the bonding pads 254*b* disposed thereon. In other words, the bonding pads 254*a* are electrically connected to the redistribution circuit structure 230 and the bonding pads 254*b* are electrically connected to the redistribution circuit structure 240. Through the redistribution circuit structure 230, the bonding pads 254*a* are electrically connected to the substrate 210 and/or the through vias 220; and through the redistribution circuit structure 240, the bonding pads 254*b* are electrically connected to the substrate 210 and/or the through vias 220. In some embodiments, the bonding pads 254*a*, 254*b* may include under bump metallurgies (UBMs), however the disclosure is not limited thereto.

Continued on FIG. 11, in some embodiments, at least one of the integrated circuit component 100 depicted in FIG. 10 is provided and bonded to the carrier substrate 200. As shown in FIG. 11, for example, the integrated circuit component 100 is bonded to the carrier substrate 200 through flip chip bonding. In some embodiments, the conductive vias CV of the integrated circuit component 100 is physically connected to the bonding pads 254*a* of the carrier substrate 200. In other words, through the conductive vias CV and the bonding pads 254*a*, the integrated circuit component 100 is electrically connected to the carrier substrate 200.

Figure 12:
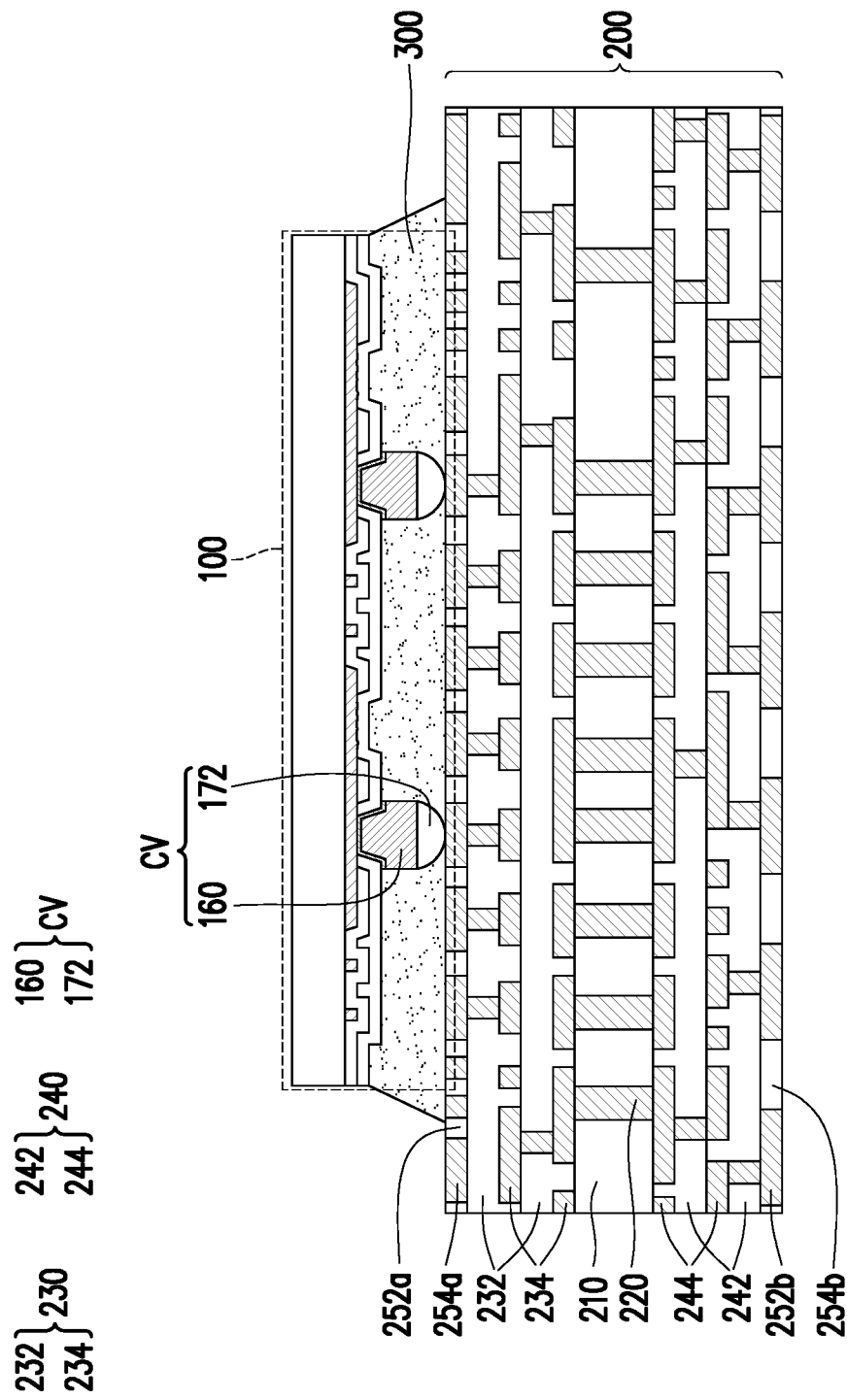

Referring to FIG. 12, in some embodiments, an underfill 300 is formed on the carrier substrate 200. As shown in FIG. 12, for example, the underfill 300 at least fills the gaps between the integrated circuit component 100 and the carrier substrate 200, and wraps sidewalls of the conductive vias CV (e.g. sidewalls of the conductive pillars 160 and the conductive bumps 172). In some embodiments, a sidewall of the integrated circuit component 100 may further covered by the underfill 300, the disclosure is not limited thereto. The underfill 300 may be any acceptable material, such as a polymer, epoxy, molding underfill, or the like, for example. In one embodiment, the underfill 300 may be formed by underfill dispensing or any other suitable method.

Figure 13:
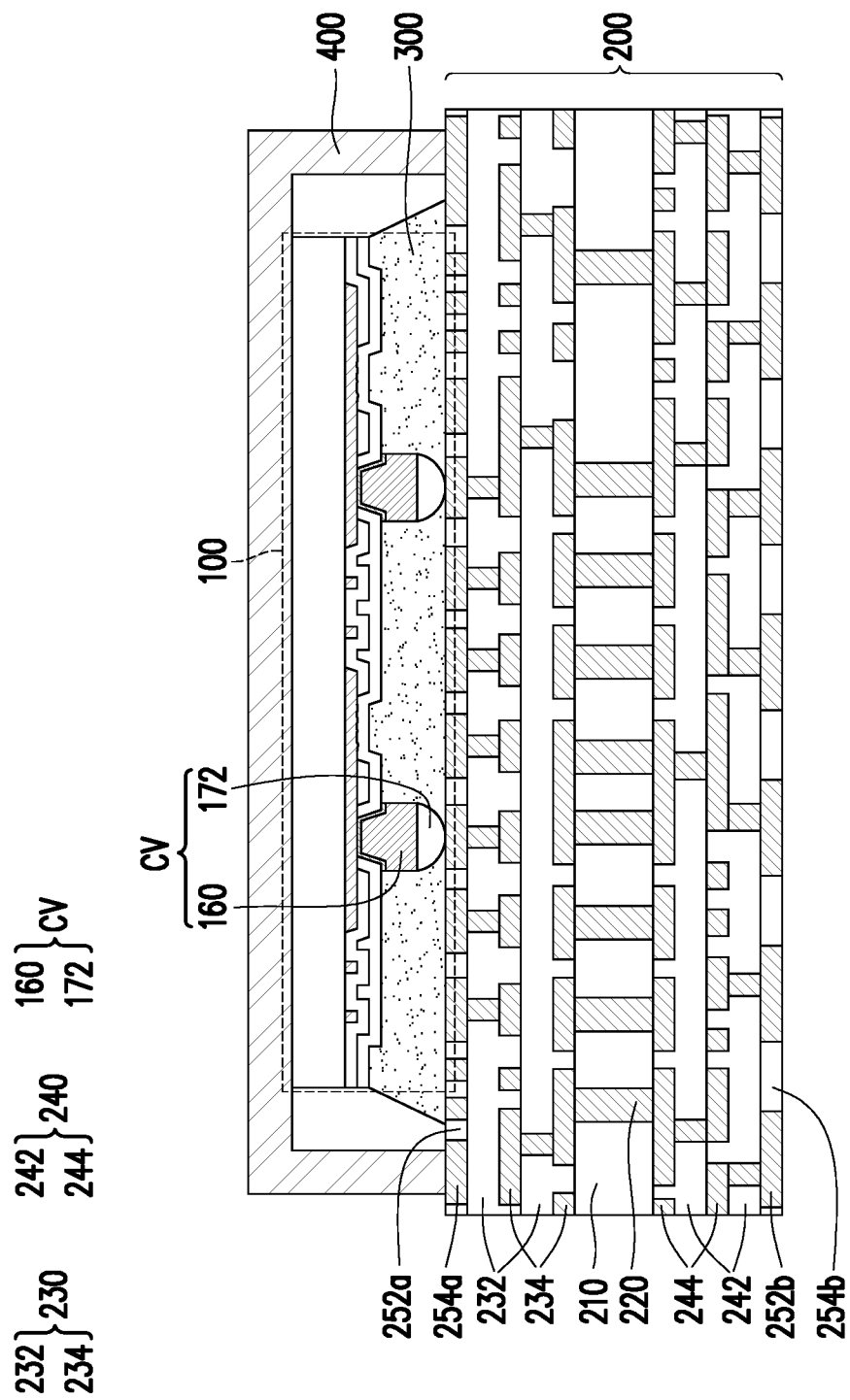

Referring to FIG. 13, in some embodiments, a heat dissipation lid 400 is provided and bonded to the carrier substrate 200. In some embodiments, the heat dissipation lid 400 may provide physical protection to the integrated circuit component 100 in addition to dissipating heat. The heat dissipation lid 400 may have a high thermal conductivity, for example, between about 200 watts per meter kelvin (W/m·K) to about 400 W/m·K or more, and may be formed using a metal, a metal alloy, and the like. The heat dissipation lid 400 is attached to the carrier substrate 200, in some embodiments using adhesive or the like, so that the integrated circuit component 100 is arranged within an inner cavity of the heat dissipation lid 400.

In some embodiments, one or more than one surface devices (not shown) may be disposed within the inner cavity of the heat dissipation lid 400. In some embodiments, one or more than one surface devices (not shown) may be disposed on the carrier substrate 200 outside a perimeter of the heat dissipation lid 400. The disclosure is not limited thereto. In addition, in some embodiments, a thermal interface material (not shown) may be applied between the that the integrated circuit component 100 and the heat dissipation lid 400, where the thermal interface material may help to dissipate heat from the integrated circuit component 100 to the heat dissipation lid 400, thereby helping to maintain a lower temperature in the package structure 10. The thermal interface material may comprise any suitable thermally conductive material, for example, a polymer having a good thermal conductivity, which may be between about 3 W/m·K to about 10 W/m·K or more.

Figure 14:
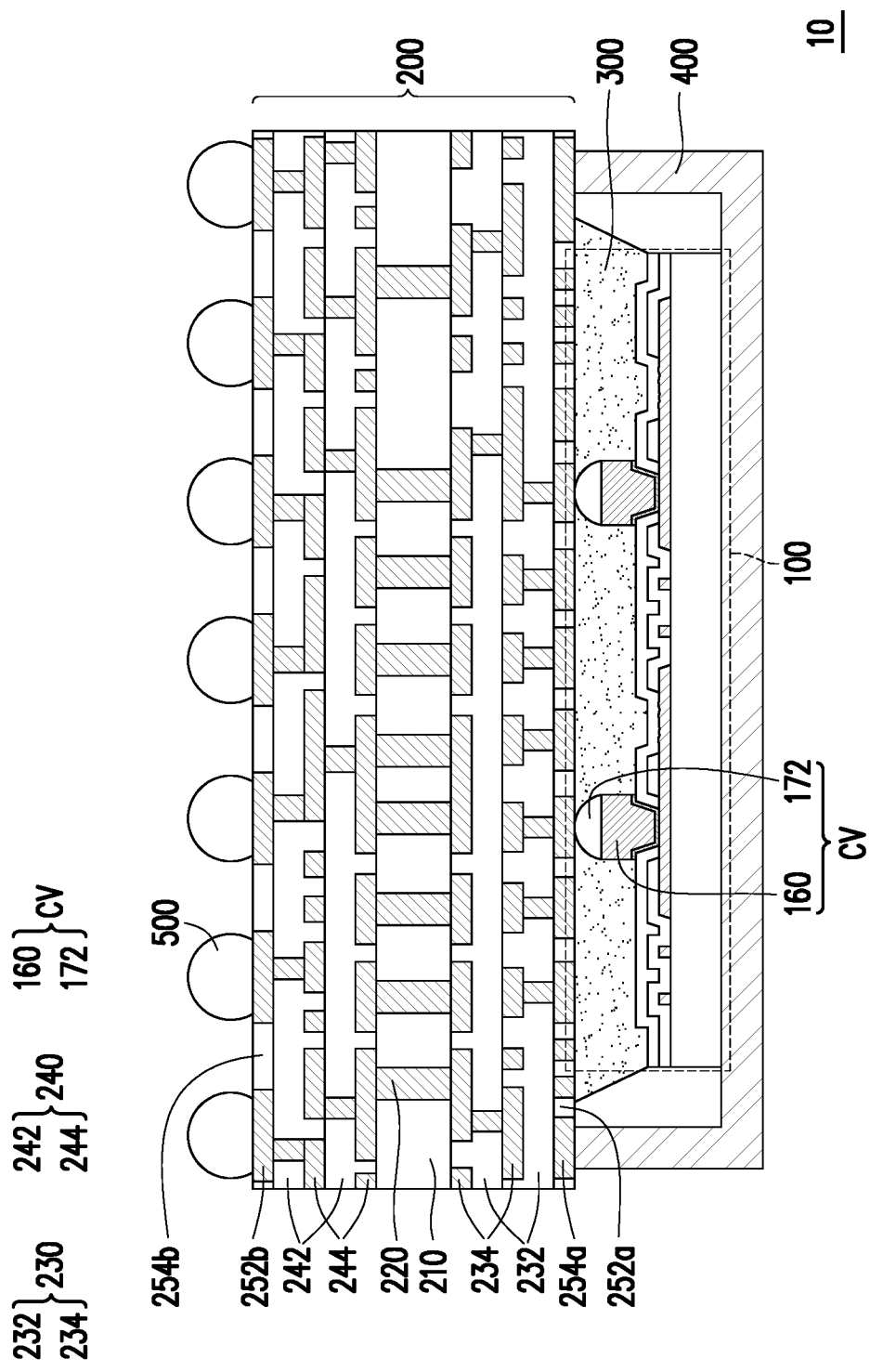

Referring to FIG. 14, in some embodiments, the whole structure depicted in FIG. 13 is flipped (turned upside down), and a plurality of conductive elements 500 are respectively formed on the bonding pads 254*b*. As shown in FIG. 14, for example, the conductive elements 500 are physically connected to the bonding pads 254*b*. In other words, the conductive elements 500 are electrically connected to the carrier substrate 200 through the bonding pads 254*b*. Through the bonding pads 254*b*, some of the conductive elements 500 are electrically connected to the integrated circuit component 100. In some embodiments, the conductive elements 500 are, for example, solder balls or ball grid array (BGA) balls. Up to this, the package structure 10 are manufactured.

FIG. 15 to FIG. 20 are schematic cross sectional views of various stages in a manufacturing method of a package structure in accordance with some embodiments of the disclosure. In embodiments, the manufacturing method is part of a wafer level packaging process. In FIG. 15 to FIG. 20, one integrated circuit components 100 are shown to represent the number of the integrated circuit component 100 included in a package structure 20, for example. However, the disclosure is not limited thereto, and one or more than one integrated circuit components 100 may be included in the package structure 20.

Figure 15:
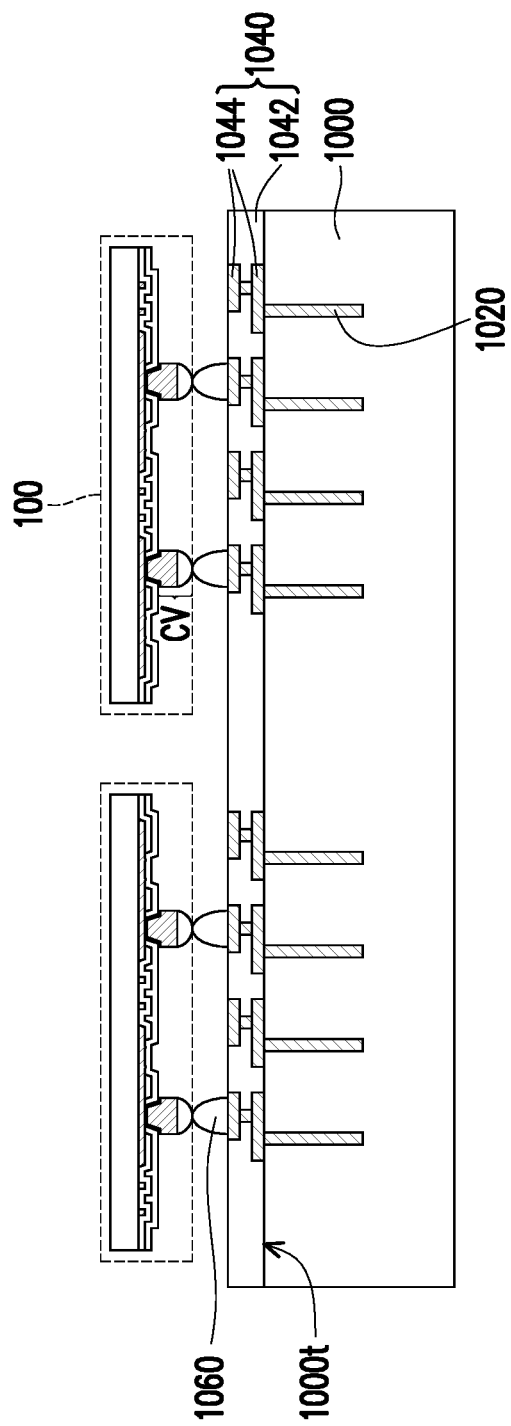
FIG. 15 to FIG. 20 are schematic cross sectional views of various stages in a manufacturing method of a package structure in accordance with some embodiments of the disclosure.

Referring to FIG. 15, in some embodiments, a substrate 1000 is provided, where the integrated circuit component 100 depicted in FIG. 10 is picked and placed on the substrate 1000, and is bonded to the substrate 1000 through the conductive vias CV. In some embodiments, the substrate 1000 may be a wafer, such as a bulk semiconductor substrate, SOI substrate, multi-layered semiconductor substrate, or the like. The semiconductor material of the substrate 1000 may be silicon, germanium, a compound semiconductor including silicon germanium, silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof, in some embodiments. In an alternative embodiment, other substrates, such as multi-layered or gradient substrates, may also be used. The substrate 1000, for example, may be doped or undoped and may further include active and/or passive devices, such as transistors, capacitors, resistors, diodes, and the like formed in and/or on a surface 1000t of the substrate 1000. In some embodiments, the surface 1000t may be referred to as an active surface of the substrate 1000. In certain embodiments, the substrate 1000 may be substantially free of active and/or passive devices, the disclosure is not limited thereto.

In some embodiments, through vias 1020 are formed to extend from the surface 1000t of the substrate 1000. For example, the through vias 1020 are sometimes referred to as through-substrate-vias or through-silicon-vias as the substrate 1000 is a silicon substrate. The through vias 1020 may be formed by forming recesses in the substrate 1000 by, for example, etching, milling, laser techniques, a combination thereof, and/or the like. A thin dielectric material may be formed in the recesses, such as by using an oxidation technique. A thin barrier layer may be conformally deposited over the surface 1000t of the substrate 1000 and in the openings, such as by CVD, ALD, PVD, thermal oxidation, a combination thereof, and/or the like. The barrier layer may comprise a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the surface 1000t of the substrate 1000 by, for example, CMP. Thus, the through vias 1020 may comprise a conductive material and a thin barrier layer between the conductive material and the substrate 1000.

In some embodiments, a redistribution circuit structure 1040 is formed on the surface 1000t of the substrate 1000, and is electrically connected to the substrate 1000. In certain embodiments, the redistribution circuit structure 1040 includes sequentially forming one or more dielectric layers 1042 and one or more metallization layers 1044 in alternation, where one metallization layer 1044 is sandwiched between two dielectric layers 1042. As shown in FIG. 15, portions of a top surface of a topmost layer of the metallization layers 1044 are respectively exposed by openings formed in a topmost layer of the dielectric layers 1042, and portions of a bottom surface of a bottommost layer of the metallization layers 1044 are respectively exposed by openings formed in a bottommost layer of the dielectric layers 1042. However, the disclosure is not limited thereto. The numbers of the metallization layers and the dielectric layers included in the redistribution circuit structure 1040 is not limited thereto, and may be designated and selected based on the demand. The material and formation of the dielectric layers 1042 may be the same or similar to the material and formation of the dielectric layers 232, the material and formation of the metallization layers 1044 may be the same or similar to the material and formation of the metallization layers 234, and thus may not be repeated herein. As shown in FIG. 15, the through vias 1020 are connected to the portions of the bottom surface of the bottommost layer of the metallization layers 1044 are respectively exposed by the openings formed in the bottommost layer of the dielectric layers 1042. In other words, the redistribution circuit structure 1040 are electrically connected to the through vias 1020. In an alternative embodiment, the redistribution circuit structure 1040 may further be electrically connected to the active and/or passive devices embedded in or formed on the surface 1000t of the substrate 1000.

In some embodiments, a plurality of electrical connectors 1060 are formed on the redistribution circuit structure 1040. As shown in FIG. 15, for example, the electrical connectors 1060 are formed on the portions of the top surface of the topmost layer of the metallization layers 1044 are respectively exposed by the openings formed in the topmost layer of the dielectric layers 1042. In other words, the electrical connectors 1060 are electrically connected to the redistribution circuit structure 1040. In an alternative embodiment, through the redistribution circuit structure 1040, some of the electrical connectors 1060 may further be electrically connected to the substrate 1000 (e.g. the active and/or passive devices embedded therein or formed on the surface 1000t) and the through vias 1020.

In some embodiments, the electrical connectors 1060 may include ball grid array (BGA) connectors, solder balls, metal pillars, controlled collapse chip connection (C4) bumps, micro bumps, electroless nickel-electroless palladium-immersion gold technique (ENEPIG) formed bumps, or the like. The material of the electrical connectors 1060, for example, may include a conductive material such as solder, copper, aluminum, gold, nickel, silver, palladium, tin, or the like, or a combination thereof. In one embodiment, the material of the electrical connectors 1060, for example, may be solder-free. The cross-sectional view of the electrical connector 1060 is not limited to the embodiments, and may has any suitable shape based on the demand. Referring back to FIG. 15, for example, the integrated circuit component 100 is electrically connected to the substrate 1000 through the conductive vias CV and the electrical connectors 1060.

Figure 16:
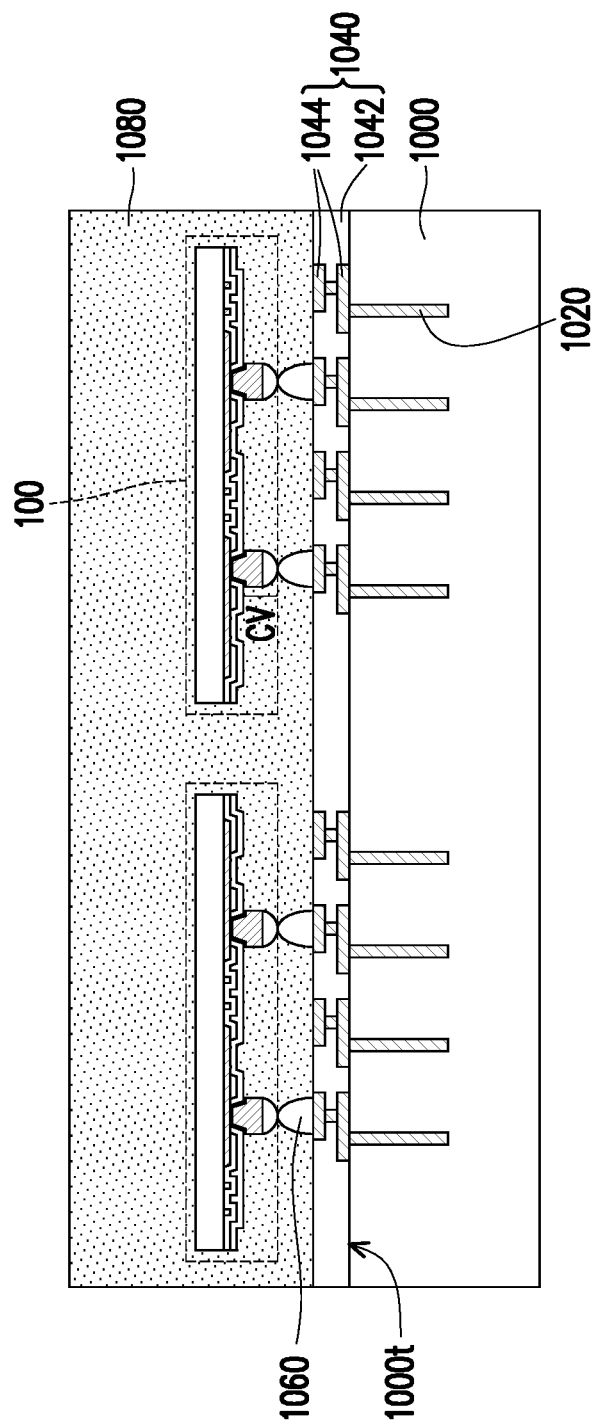

Referring to FIG. 16, in some embodiments, an insulating encapsulation 1080 is formed over the substrate 1000, where the integrated circuit component 100 is encapsulated in the insulating encapsulation 1080, and the redistribution circuit structure 1040 exposed by the electrical connectors 1060 is covered by the insulating encapsulation 1080. As shown in FIG. 16, for example, the integrated circuit component 100, the conductive vias CV and the electrical connectors 1060 are surrounded and covered by the insulating encapsulation 1080. That is, the integrated circuit component 100, the conductive vias CV and the electrical connectors 1060 are embedded in the insulating encapsulation 1080. In some embodiments, the insulating encapsulation 1080 is a molding compound formed by a molding process, and the material of the insulating encapsulation 1080 may include epoxy or other suitable resins. For example, the insulating encapsulation 1080 may be epoxy resin containing chemical filler.

Figure 17:
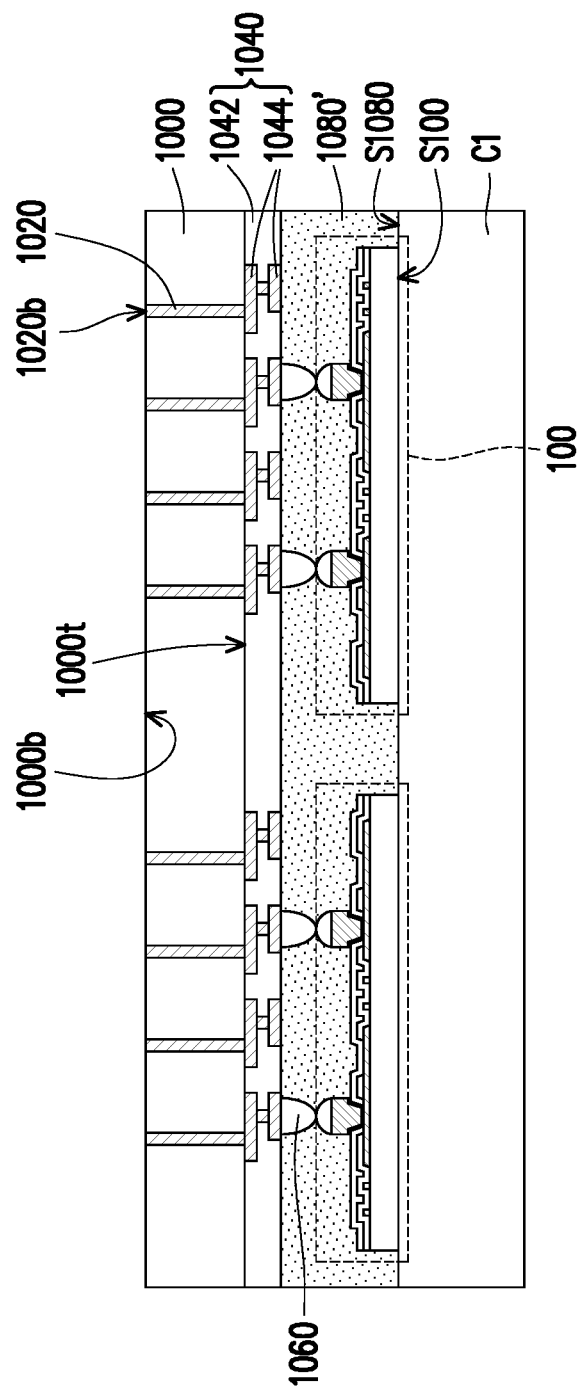

Referring to FIG. 16 and FIG. 17, in some embodiments, the insulating encapsulation 1080 is planarized until a backside surface S100 of the integrated circuit component 100 is exposed. After the insulating encapsulation 1080 is planarized, an insulating encapsulation 1080 is formed, and the backside surface S100 of the integrated circuit component 100 is exposed by a surface S1080 of the planarized insulating encapsulation 1080'. During the planarized process of the insulating encapsulation 1080, the integrated circuit component 100 may also be planarized. The insulating encapsulation 1080' may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method.

In some embodiments, after the planarized insulating encapsulation 1080' is formed, the planarized insulating encapsulation 1080' is placed on a carrier C1, and the substrate 1000 is then planarized until backside surfaces 1020b of the through vias 1020 embedded in the substrate 1000 is exposed. After the substrate 1000 is planarized, the backside surfaces 1020b of the through vias 1020 are exposed by a surface 1000b of the substrate. During the planarized process of the substrate 1000, the through vias 1020 may also be planarized. The insulating encapsulation 1080' may be formed by mechanical grinding or CMP, for example. After the planarizing process, a cleaning step may be optionally performed, for example to clean and remove the residue generated from the planarizing step. However, the disclosure is not limited thereto, and the planarizing step may be performed through any other suitable method. As shown in FIG. 17, the surface 1020b of the through vias 1020 is substantially levelled with and coplanar to the surface 1000b of the substrate 1000, and the surface S100 of the integrated circuit component 100 is substantially levelled with and coplanar to the surface S1080 of the planarized insulating encapsulation 1080, for example.

Figure 18:
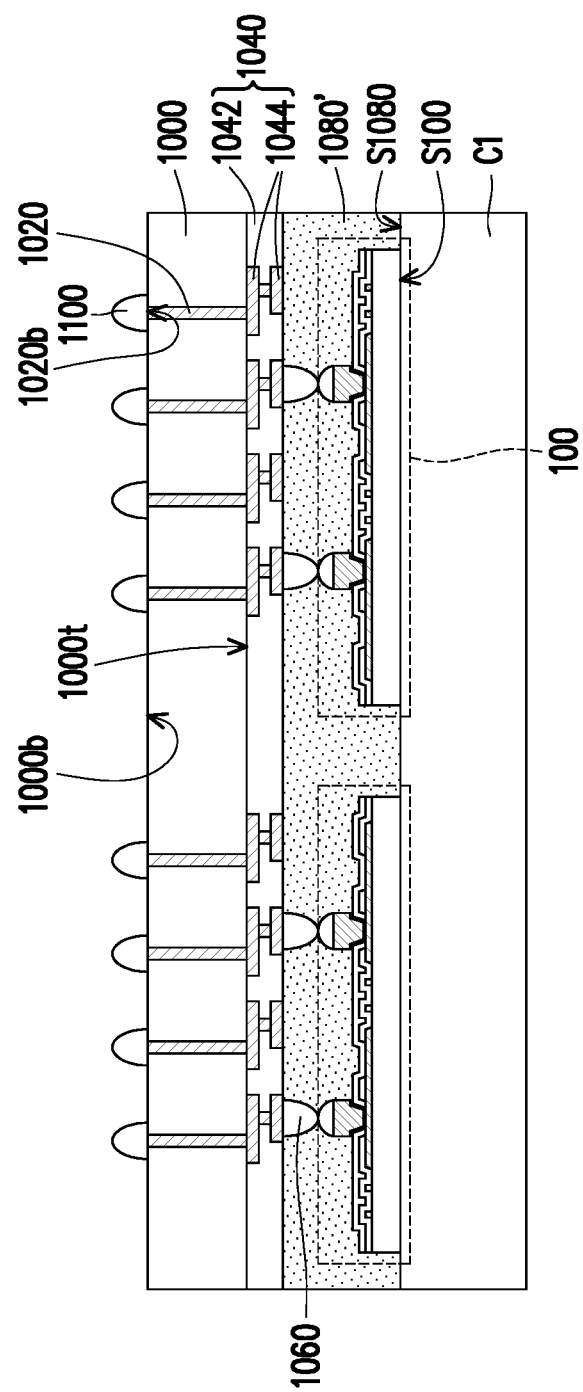

Referring to FIG. 18, in some embodiments, a plurality of electrical connectors 1100 are formed on the semiconductor 1000, where the electrical connectors 1100 are connected to the through vias 1020. As shown in FIG. 18, the electrical connectors 1100 are formed on the semiconductor 1000 corresponding to the positioning location of the through vias 1020, and thus the electrical connectors 1100 are in contact to the surfaces of the through vias 1020, respectively, for example. In some embodiments, through the through vias 1020, the redistribution circuit structure 1040 and the electrical connectors 1060, some of the electrical connectors 1060 are electrically connected to the integrated circuit component 100. In an alternative embodiment, some of the electrical connectors 1060 may further be electrically connected to the active and passive devices embedded in or formed on the surface 1000t of the substrate 1000. The material and formation of the electrical connectors 1100 are the same or similar to the material and formation of the electrical connectors 1060, and thus may not be repeated herein. In one embodiment, the electrical connectors 1100 may be the same as the electrical connectors 1060. In an alternative embodiment, the electrical connectors 1100 may be different from the electrical connectors 1060.

Figure 19:
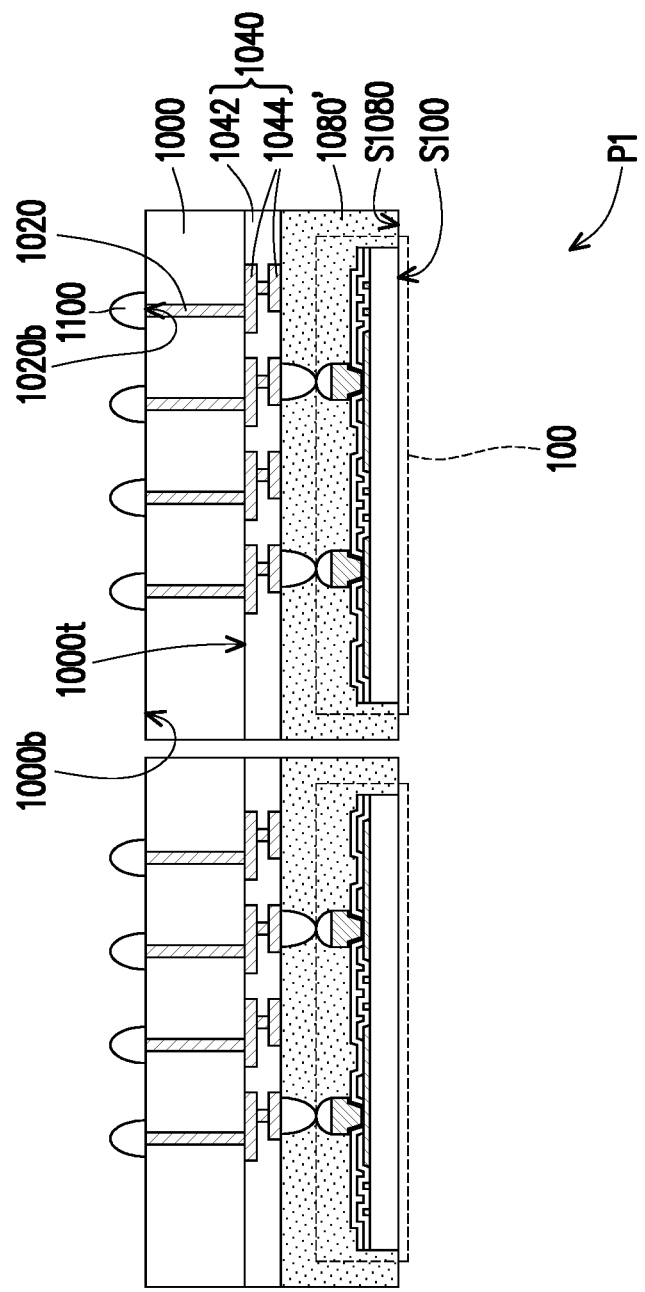

Referring to FIG. 19, in some embodiments, a dicing (or singulation) process is sequentially performed to cut through the whole structure depicted in FIG. 18 into individual and separated chip package P1. In one embodiment, the dicing process is a wafer dicing process including mechanical blade sawing or laser cutting. The disclosure is not limited thereto. Prior to the dicing process, the carrier C1 is debonded from the integrated circuit component 100 (e.g. from the surface S100 of the integrated circuit component 100) and the planarized insulating encapsulation 1080' (e.g. from the surface S1080 of the planarized insulating encapsulation 1080'), where a holding device (not shown) is adopted to hold the electrical connectors 1100 for securing whole structure depicted in FIG. 18 before debonding the carrier C1 to prevent damages caused by the sequential process(es) or transportation. For example, the holding device may be an adhesive tape, a carrier film or a suction pad. The dicing (or singulation) process is performed, for example, before the electrical connectors 1100 are released from the holding device.

Figure 20:
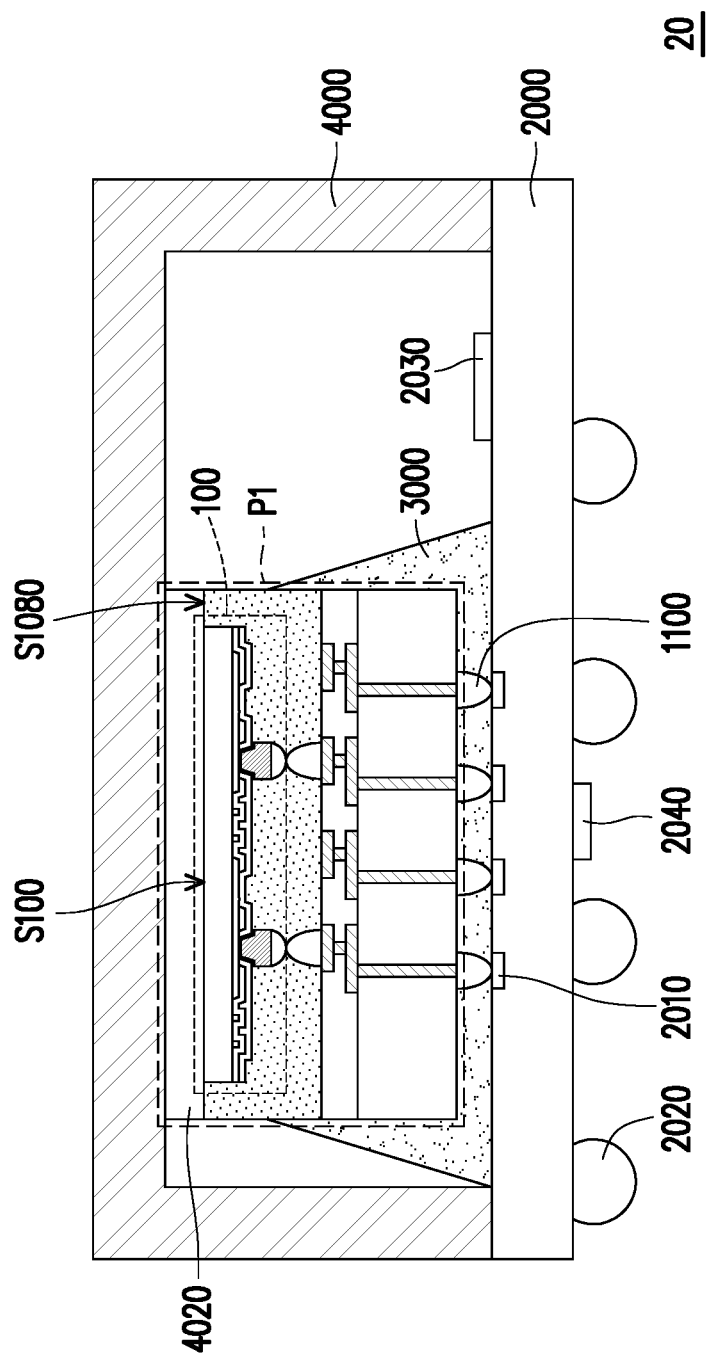

Referring to FIG. 20, in some embodiments, the chip package P1 depicted in FIG. 19 is flipped and bonded to a substrate 2000 through the electrical connectors 1100. The substrate 2000 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. In some embodiments, the substrate 2000 may be a SOI substrate, where the SOI substrate may include a layer of a semiconductor material such as epitaxial silicon, germanium, silicon germanium, SOI, silicon germanium on insulator (SGOI), or combinations thereof. In an alternative embodiment, the substrate 2000 may be based on an insulating core, such as a fiberglass reinforced resin core. One example core material is fiberglass resin such as flame retardant class 4 (FR4). Alternatives for the core material include bismaleimide triazine (BT) resin, or alternatively, other printed circuit board (PCB) materials or films. In a further alternative embodiment, the substrate 2000 may be a build-up films such as Ajinomoto build-up film (ABF) or other suitable laminates. In some embodiments, the substrate 2000 may include active and/or passive devices (not shown), such as transistors, capacitors, resistors, combinations thereof, or the like which may be used to generate the structural and functional requirements of the design for the semiconductor package. The active and/or passive devices may be formed using any suitable methods.

In some embodiments, the substrate 2000 includes metallization layers and vias (not shown) and bonding pads 2010 connected to the metallization layers and vias. The metallization layers may be formed over the active and/or passive devices and are designed to connect the various devices to form functional circuitry. The metallization layers may be formed of alternating layers of dielectric (e.g. low-k dielectric material) and conductive material (e.g., copper) with vias interconnecting the layers of conductive material and may be formed through any suitable process (such as deposition, damascene, dual damascene, or the like). In certain embodiments, the substrate 2000 is substantially free of active and/or passive devices. The material of the bonding pads 2010 is the same or similar to the bonding pads 254a and 254b, and thus may not be repeated herein. As shown in FIG. 20, for example, the conductive vias CV of the chip package P1 are connected to the bonding pads 2010 of the substrate 2000, respectively. Through bonding pads 2010 and the conductive vias CV, the chip package P1 is electrically connected to the substrate 2000.

In some embodiments, the substrate 2000 includes conductive elements 2020 on a bottom surface of substrate 2000, as shown in FIG. 20. Conductive elements 2020 may be used to physically and electrically connect the substrate

2000 to other devices, packages, components, and the like, in some embodiments. As shown in FIG. 20, the conductive elements 2020 and the chip package P1 are respectively located on two opposite sides of the substrate 2000, where some of the conductive elements 2020 are electrically connected to the chip package P1 through the bonding pads 2010 and the conductive vias CV.

In certain embodiments, one or more surface devices 2030, 2040 may be connected to the substrate 2000. The surface devices 2030, 2040 may be, for example, used to provide additional functionality or programming to the package structure 20. In an embodiment, the surface devices 2030, 2040 may include surface mount devices (SMDs) or an integrated passive devices (IPDs) that comprise passive devices such as resistors, inductors, capacitors, jumpers, combinations of these, or the like that are desired to be connected to and utilized in conjunction with the package structure 20. For example, as shown in FIG. 20, the surface devices 2030 is placed on a surface of the substrate 2000 where the chip package P1 disposed, and the surface devices 2040 is placed on a surface of the substrate 2000 where the conductive elements 2020 disposed. The number of the surface devices 230, 240 is not limited to the embodiment, and may be selected based on the demand and design layout. The disclosure is not limited thereto. In one embodiment, only the surface device 230 is formed on the substrate 2000, where the number of the surface device 230 may be one or more than one. In an alternative embodiment, only the surface device 240 is formed on the substrate 2000, where the number of the surface device 240 may be one or more than one.

In some embodiments, an underfill 3000 is formed on the substrate 2000. As shown in FIG. 20, for example, the underfill 3000 at least fills the gaps between the chip package P1 and the substrate 2000, and wraps sidewalls of the electrical connectors 1100. In some embodiments, a sidewall of the chip package P1 is covered by the underfill 3000. The underfill 3000 may be any acceptable material, such as a polymer, epoxy, molding underfill, or the like, for example. In one embodiment, the underfill 3000 may be formed by underfill dispensing or any other suitable method. The materials of the underfill 300 and the underfill 300 may be the same or different, the disclosure is not limited thereto.

Continued on FIG. 20, in some embodiments, a heat dissipation lid 4000 is provided and bonded to the substrate 2000. In some embodiments, the heat dissipation lid 4000 may provide physical protection to the chip package P1 in addition to dissipating heat. The heat dissipation lid 4000 may have a high thermal conductivity, for example, between about 200 W/m·K to about 400 W/m·K or more, and may be formed using a metal, a metal alloy, and the like. The heat dissipation lid 4000 is attached to the substrate 2000, in some embodiments using adhesive or the like, so that the chip package P1 including the integrated circuit component 100 is arranged within an inner cavity of the heat dissipation lid 4000.

In some embodiments, a thermal interface material 4020 is applied between the that the chip package P1 and the heat dissipation lid 4000, where the thermal interface material 4020 further helps to dissipate heat from the chip package P1 to the heat dissipation lid 4000, thereby helping to maintain a lower temperature in the package structure 20. The thermal interface material 4020 may comprise any suitable thermally conductive material, for example, a polymer having a good thermal conductivity, which may be between about 3 W/m·K to about 10 W/m·K or more. Up to this, the package structure 20 are manufactured.

In accordance with some embodiments, a package structure includes a semiconductor substrate, conductive pads, and conductive vias. The conductive pads are located on and electrically connected to the semiconductor substrate, and each have a testing region and a contact region comprising a core contact region and a buffer contact region, wherein along one direction, the conductive pads each have a maximum length less than a sum of a maximum length of the testing region and a maximum length of the buffer contact region. The conductive vias are respectively located on the core contact regions of the conductive pads.

In accordance with some embodiments, a package structure includes a semiconductor substrate, conductive pads, a passivation layer, and conductive vias. The semiconductor substrate has an active surface. The conductive pads are located on the active surface of the semiconductor substrate, are electrically connected to the semiconductor substrate, and each have a contact region and a testing region, wherein in each of the conductive pads, an edge of the contact region is in contact with an edge of the testing region. The passivation layer is located on the semiconductor substrate, wherein the conductive pads are located between the semiconductor substrate and the passivation layer, and the testing regions and the contact regions of the conductive pads are exposed by the passivation layer. The conductive vias are respectively located on the contact regions of the conductive pads.

In accordance with some embodiments, a package structure includes a carrier substrate, an integrated circuit component, and an underfill. The integrated circuit component is located on the carrier substrate, wherein the integrated circuit component includes a semiconductor substrate, conductive pads and conductive vias. The conductive pads are located on and electrically connected to the semiconductor substrate and each have a testing region and a contact region comprising a core contact region and a buffer contact region, wherein along one direction, the conductive pads each have a maximum length less than a sum of a maximum length of the testing region and a maximum length of the buffer contact region. The conductive vias are respectively located on the core contact regions of the conductive pads, wherein the integrated circuit component is electrically connected to the carrier substrate through the conductive vias. The underfill encapsulates sidewalls of the conductive vias.

In accordance with some embodiments, an integrated circuit component includes a semiconductor substrate, conductive pads, a passivation layer and conductive vias. The semiconductor substrate has an active surface. The conductive pads are located on the active surface of the semiconductor substrate and electrically connected to the semiconductor substrate, and the conductive pads each have a contact region and a testing region. In each of the conductive pads, an edge of the contact region is in contact with an edge of the testing region. The passivation layer is located on the semiconductor substrate, where the conductive pads are located between the semiconductor substrate and the passivation layer, and the testing regions and the contact regions of the conductive pads are exposed by the passivation layer. The conductive vias are respectively located on the contact regions of the conductive pads.

In accordance with some embodiments, a package structure includes a carrier substrate, an integrated circuit component, conductive vias and an underfill. The integrated circuit component is located on the carrier substrate, where the integrated circuit component includes a semiconductor substrate and conductive pads. The conductive pads are located on and electrically connected to the semiconductor substrate, and the conductive pads each have a contact region and a testing region. In each of the conductive pads, an edge of the contact region is in contact with an edge of the testing region. The conductive vias are respectively located on the contact regions of the conductive pads, where the integrated circuit component is electrically connected to the carrier substrate through the conductive vias. The underfill encapsulates sidewalls of the conductive vias.

In accordance with some embodiments, an integrated circuit component includes a semiconductor substrate, conductive pads and conductive vias. The conductive pads are located on and electrically connected to the semiconductor substrate, where each of the conductive pads includes a contact region having a first edge and a testing region having a second edge, and the first edge of the contact region is in contact with the second edge of the testing region. The alignment mark is located at a location aligned with the second edge of the testing region. The conductive vias are respectively located on the contact regions of the conductive pads.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A method of manufacturing an integrated circuit component, comprising:
   providing a wafer comprising a semiconductor substrate and conductive pads on the semiconductor substrate, wherein providing the wafer comprises:
      providing the semiconductor substrate; and
      forming the conductive pads on the semiconductor substrate, the conductive pads being electrically connected to the semiconductor substrate and each having a testing region and a contact region comprising a core contact region and a buffer contact region, wherein along one direction, the conductive pads each have a maximum length less than a sum of a maximum length of the testing region and a maximum length of the buffer contact region;
   forming conductive vias respectively on the contact regions of the conductive pads; and
   dicing the wafer to form the integrated circuit component.

2. The method of claim 1, prior to forming the conductive vias respectively on the contact regions, further comprising:
   forming a passivation layer over the wafer on the semiconductor substrate to partially cover the conductive pads.

3. The method of claim 2, wherein forming the passivation layer over the wafer comprises:
   forming a first dielectric layer on the wafer to cover up the semiconductor substrate and the conductive pads; and
   patterning the first dielectric layer to form the passivation layer having a plurality of first opening to expose the testing regions and the contact regions of the conductive pads.

4. The method of claim 2, after forming the passivation layer over the wafer and prior to forming the conductive vias respectively on the contact regions, comprising:
   forming a second dielectric layer on the passivation layer to cover the conductive pads; and
   patterning the second dielectric layer to form a pos-passivation layer having a plurality of second opening to expose the contact regions of the conductive pads.

5. The method of claim 1, prior to forming the conductive vias respectively on the contact regions, comprising:
   performing an electrical circuit testing to the testing region of at least one of the conductive pads.

6. The method of claim 5, wherein the electrical circuit testing comprises a wafer acceptable test, a circuit probing test, or a combination thereof.

7. The method of claim 1, wherein forming the conductive pads further comprises forming an alignment mark at an edge thereof, the alignment mark being aligned with an edge of the testing region immediately adjacent to the core contact region.

8. A method of manufacturing a package structure, comprising:
   providing an integrated circuit component as claimed in claim 1;
   mounting the integrated circuit component on an circuit board; and
   forming a first underfill wrapping around the conductive vias.

9. The method of claim 8, further comprising:
   providing and bonding a heat dissipating element to the circuit board, wherein the integrated circuit component is located inside a space confined by the circuit board and the heat dissipating element.

10. The method of claim 8, prior to mounting the integrated circuit component on the circuit board, further comprising:
    providing an interposer;
    mounting the integrated circuit component to the interposer through the conductive vias;
    mounting the interposer to the circuit board through a plurality of conductive terminals therebetween; and
    forming a second underfill wrapping around the conductive terminals and filling up a gap between the interposer and the circuit structure, and a gap between integrated circuit component and the interposer is filled up by the first underfill.

11. The method of claim 10, further comprising:
    providing and bonding a heat dissipating element to the interposer, wherein the integrated circuit component is located inside a space confined by the interposer and the heat dissipating element.

12. A method of manufacturing an integrated circuit component, comprising:
    providing a wafer comprising a semiconductor substrate and conductive pads on the semiconductor substrate, wherein providing the wafer comprises:
       providing the semiconductor substrate; and
       forming the conductive pads on the semiconductor substrate, the conductive pads being electrically connected to the semiconductor substrate and each having a contact region and a testing region;
    performing an electrical circuit testing to the testing region of at least one of the conductive pads, a surface roughness of a surface of the testing region of the at least one of the conductive pads is greater than a surface roughness of a surface of a respective one of the contact regions;
    forming conductive vias respectively on the contact regions of the conductive pads; and
    dicing the wafer to form the integrated circuit component.

13. The method of claim 12, wherein the electrical circuit testing comprises a wafer acceptable test, a circuit probing test, or a combination thereof.

14. The method of claim 12, wherein forming the conductive pads further comprises forming an alignment mark at an edge thereof, the alignment mark being aligned with an edge of the testing region immediately adjacent to the contact region.

15. A method of manufacturing a package structure, comprising:
providing an integrated circuit component as claimed in claim 12;
mounting the integrated circuit component on an circuit board; and
forming a first underfill wrapping around the conductive vias.

16. The method of claim 15, prior to mounting the integrated circuit component on the circuit board, further comprising:
providing an interposer;
mounting the integrated circuit component to the interposer through the conductive vias;
mounting the interposer to the circuit board through a plurality of conductive terminals therebetween; and
forming a second underfill wrapping around the conductive terminals and filling up a gap between the interposer and the circuit structure, and a gap between integrated circuit component and the interposer is filled up by the first underfill.

17. A method of manufacturing an integrated circuit component, comprising:
providing a wafer comprising a semiconductor substrate and conductive pads on the semiconductor substrate, wherein providing the wafer comprises:
providing the semiconductor substrate; and
forming the conductive pads on the semiconductor substrate, the conductive pads being electrically connected to the semiconductor substrate and each having a testing region, a contact region and an alignment mark aligning with an edge of the testing region immediately adjacent to the contact region;
forming conductive vias respectively on the contact regions of the conductive pads; and
dicing the wafer to form the integrated circuit component.

18. The method of claim 17, wherein the alignment marks each are formed in in form of a notch having an include angle ranging from about 30 degrees to about 150 degrees.

19. The method of claim 17, wherein the alignment marks each are formed in in form of a notch having an include angle ranging from about 30 degrees to about 330 degrees.

20. A method of manufacturing a package structure, comprising:
providing an integrated circuit component as claimed in claim 17;
mounting the integrated circuit component on an circuit board; and
forming an underfill wrapping around the conductive vias.

* * * * *